US011600792B2

(12) United States Patent
Song

(10) Patent No.: US 11,600,792 B2
(45) Date of Patent: Mar. 7, 2023

(54) APPARATUS FOR AND METHOD OF MANUFACTURING DISPLAY APPARATUS

(71) Applicant: Samsung Display Co., Ltd., Yongin-si (KR)

(72) Inventor: Seungyong Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 217 days.

(21) Appl. No.: 16/910,912

(22) Filed: Jun. 24, 2020

(65) Prior Publication Data
US 2021/0111356 A1 Apr. 15, 2021

(30) Foreign Application Priority Data
Oct. 15, 2019 (KR) .................. 10-2019-0127870

(51) Int. Cl.
| | | |
|---|---|---|
| H01L 51/00 | (2006.01) | |
| H01L 27/32 | (2006.01) | |
| C23C 16/04 | (2006.01) | |
| H01L 51/56 | (2006.01) | |

(52) U.S. Cl.
CPC ........ *H01L 51/0096* (2013.01); *C23C 16/042* (2013.01); *H01L 27/3246* (2013.01); *H01L 51/001* (2013.01); *H01L 51/0011* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2018/0198067 A1 | 7/2018 | Kim et al. | |
| 2020/0251539 A1* | 8/2020 | Fu | H01L 27/3216 |
| 2020/0273932 A1* | 8/2020 | Liu | H01L 51/5206 |
| 2021/0335919 A1* | 10/2021 | Bai | H01L 27/326 |
| 2021/0364842 A1* | 11/2021 | Tang | G02F 1/13394 |

FOREIGN PATENT DOCUMENTS

| | | |
|---|---|---|
| JP | 6411000 | 10/2018 |
| JP | 2018-168429 | 11/2018 |
| KR | 10-2018-0083459 | 7/2018 |
| KR | 10-2018-0115387 | 10/2018 |

* cited by examiner

*Primary Examiner* — Michelle Mandala
(74) *Attorney, Agent, or Firm* — Kile Park Reed & Houtteman PLLC

(57) ABSTRACT

An apparatus for and a method of manufacturing a display apparatus are provided. Transmittance of an opening area may be improved by not forming some layers in the opening area. The display apparatus includes a substrate, a pixel defining layer disposed on the substrate, a first common layer disposed in a first opening of the substrate, and a second common layer disposed in a second opening of the substrate. The substrate includes a first display area, an opening area in the first display area, a peripheral area surrounding at least a portion of the opening area, and a second display area extended from the peripheral area to an edge of the first display area. The pixel defining layer may include the first opening in the first display area, and the second opening in the second display area.

7 Claims, 20 Drawing Sheets

FIG. 9
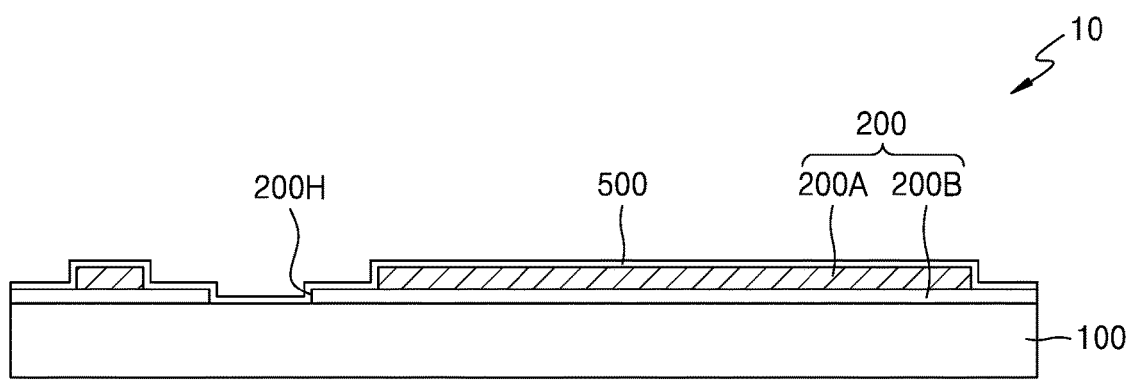
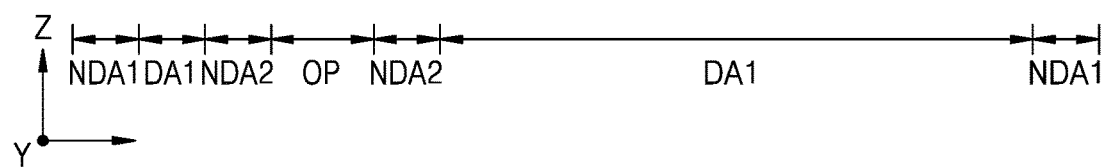

FIG. 10
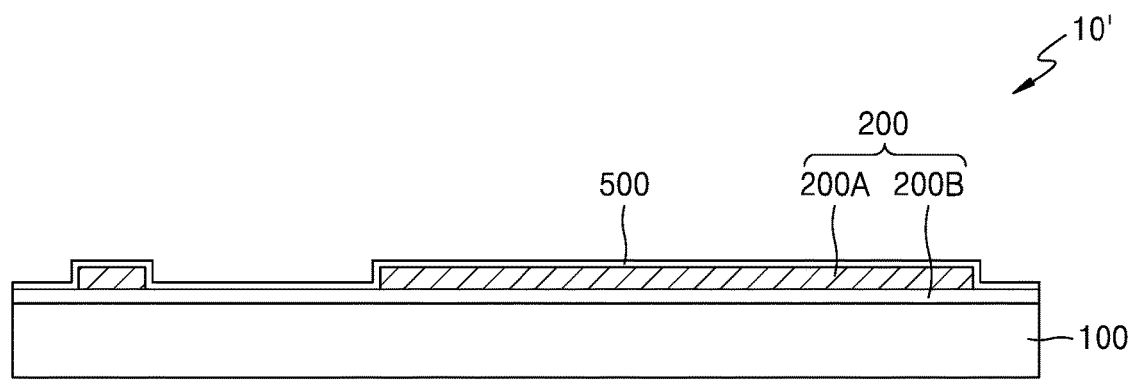
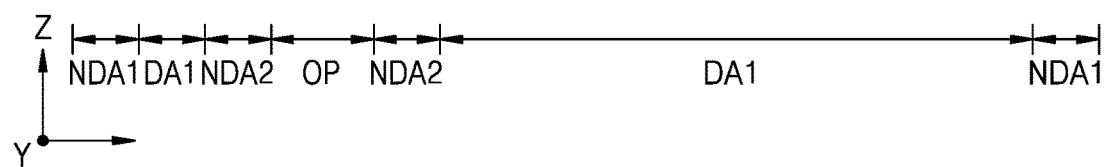

FIG. 14
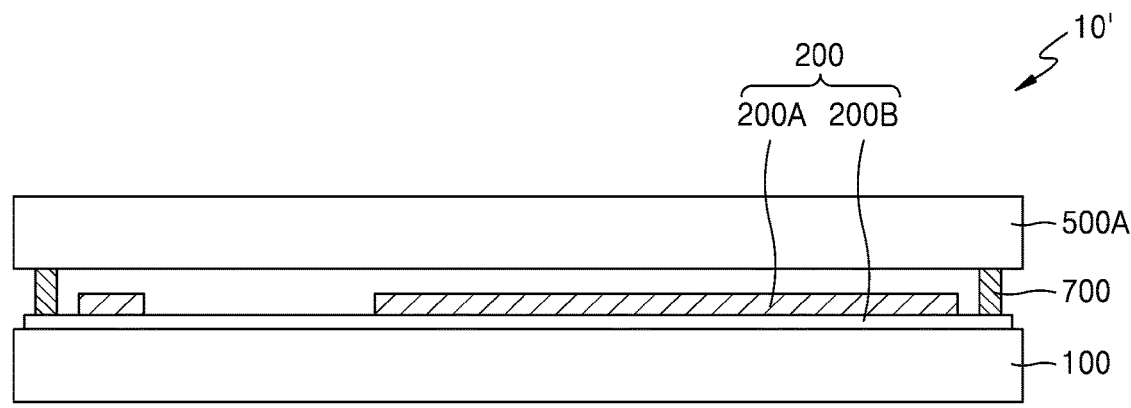

APPARATUS FOR AND METHOD OF MANUFACTURING DISPLAY APPARATUS

CROSS-REFERENCE TO RELATED APPLICATION(S)

This application claims priority to and benefits of Korean Patent Application No. 10-2019-0127870 under 35 U.S.C. § 119, filed in the Korean Intellectual Property Office on Oct. 15, 2019, the entire contents of which are incorporated herein by reference.

BACKGROUND

1. Technical Field

One or more embodiments relate to apparatuses and methods related to manufacturing a display apparatus.

2. Description of the Related Art

Applications of display devices have recently diversified. Moreover, since display devices have become thinner and lighter, their range of use has increased.

Display area of display devices has been increased, and also various functions have been added that may be applied or linked to display devices. To increase display area and also add various functions, display apparatuses capable of having various components arranged in a display area have been researched.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may include an apparatus and method of manufacturing a display apparatus that may include a display panel having, in a display area, an area where various sorts of components may be disposed. However, the embodiments are only examples, and the scope of the disclosure is not limited thereto.

Additional aspects will be set forth in part in the description which follows and, in part, will be apparent from the description, or may be learned by practice of the presented embodiments of the disclosure.

According to embodiments, a display apparatus may include a substrate comprising a first display area, an opening area in the first display area, a peripheral area surrounding at least a portion of the opening area, and a second display area extended from the peripheral area to an edge of the first display area; a pixel defining layer disposed on the substrate and including a first opening in the first display area and a second opening in the second display area; a first common layer disposed in the first opening; and a second common layer disposed in the second opening.

The first common layer and the second common layer may include at least one of an opposite electrode disposed over the first display area and the second display area, and at least one of intermediate layers of the substrate.

The edge of the first display area may be rectangular, and the second display area may be disposed diagonally to face a vertex of the first display area.

A thickness of the first common layer may be greater than a thickness of the second common layer.

A thickness of the first common layer may be substantially same as a thickness of the second common layer.

A thickness of the second common layer may decrease in a direction from an edge of the second common layer to a center of the second common layer.

A through hole may be disposed in the opening area.

According to embodiments, an apparatus for manufacturing a display apparatus may include a chamber in which a display substrate and a mask assembly are disposed; a first support that supports the display substrate; a second support that supports the mask assembly to face the display substrate; and a source facing the mask assembly and spraying a deposition material to the display substrate. The mask assembly may comprise a mask sheet comprising an opening through which the deposition material passes. The mask sheet may comprise a body portion comprising the opening; a rib extended to the body portion and dividing the opening into two regions; and a shielding portion extended to the rib, protruding from a surface of the rib toward the source, and shielding the deposition material.

The opening may be rectangular, and the rib may be disposed in a diagonal direction to face a vertex of the opening.

A first distance from a surface of the shielding portion facing the display substrate to a surface of the rib facing the display substrate may be equal to or greater than $2.7 \times 10^{-4}$ times a second distance from the source to a surface of the rib facing the source.

At least one of the body portion, the rib, and the shielding portion may include carbon fiber.

The rib and the shielding portion may include carbon fiber, and the rib may be attached to the body portion by an adhesive material.

The body portion may include a seating groove in which the rib may be inserted and seated.

The deposition material may form at least one of an opposite electrode disposed over the first display area and the second display area, and at least one of intermediate layers of the display substrate.

The mask sheet may further include a magnetic body disposed in the body portion.

According to embodiments, a method of manufacturing a display apparatus may include disposing a display substrate and a mask assembly in a chamber; aligning the display substrate with the mask assembly; supplying a deposition material from a source to the display substrate through the mask assembly; and forming an opening area in the display substrate by selectively blocking the deposition material that passes through an opening of the mask assembly, wherein the display area may include a first display area and a second display area excluding the opening area, and a thickness of deposition material in the first display area may be different from a thickness of deposition material in the second display area.

The thickness of the deposition material in the first display area may be greater than the thickness of the deposition material in the second display area.

The thickness of the deposition material in the second display area may vary in a width direction of the second display area.

The thickness of the deposition material in the second display area may decrease in a direction from an edge of the second display area to a center of the second display area.

The first display area may be rectangular, and the second display area may be disposed diagonally to face a vertex of the first display area.

The mask assembly may include a mask sheet including an opening, and the mask sheet may include a body portion comprising the opening; a rib extended to the body portion and dividing the opening into two regions; and a shielding portion extended to the rib, protruding from a surface of the rib toward the source, and shielding the deposition material.

These and/or other aspects will become apparent and more readily appreciated from the following description of the embodiments, taken in conjunction with the accompanying drawings.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 is a schematic cross-sectional view of a display panel according to another embodiment;

FIG. 10 is a schematic cross-sectional view of a display panel according to another embodiment;

FIG. 14 is a schematic cross-sectional view of a display panel according to another embodiment;

DETAILED DESCRIPTION OF THE EMBODIMENTS

Figure 1:
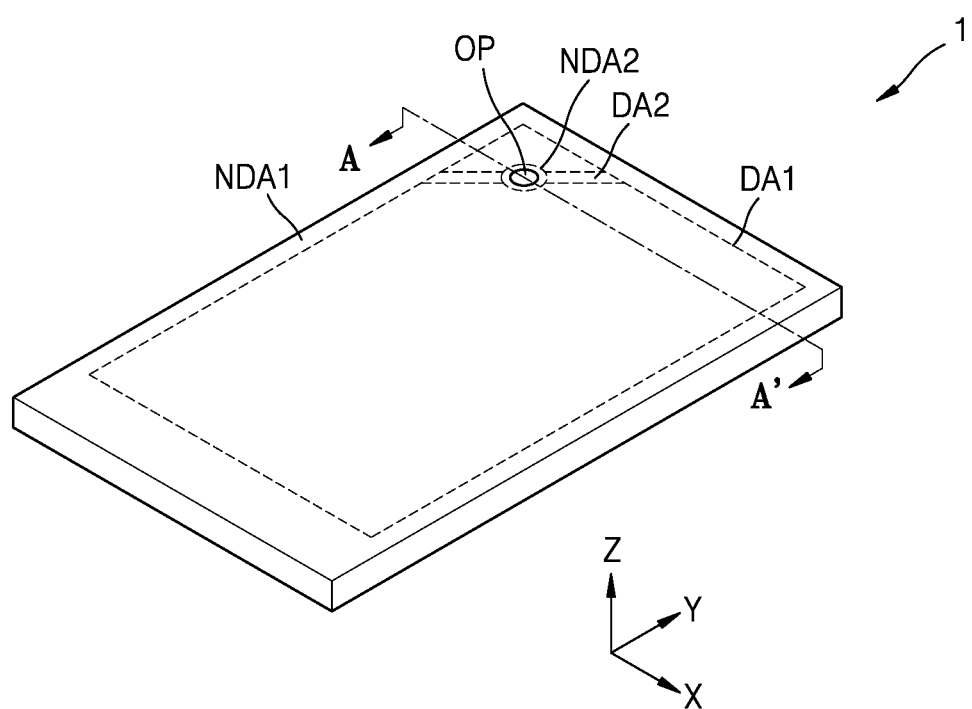
FIG. 1 is a schematic perspective view of a display apparatus according to an embodiment.

Reference will now be made in detail to embodiments, examples of which are illustrated in the accompanying drawings, wherein like reference numerals refer to like elements throughout. Redundant explanations may be omitted. The embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises", "comprising", "has", "have", "having", "includes", "including", etc. used herein specify the presence of stated features or components, but do not preclude the presence or addition of one or more other features or components.

It will be understood that when a layer, region, or component is referred to as being "on", "formed on", or the like with respect to another layer, region, or component, it can be directly or indirectly formed on the other layer, region, or component. For example, intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The term "overlap" may include layer, stack, face or facing, extending over, covering or partly covering or any other suitable term as would be appreciated and understood by those of ordinary skill in the art.

The phrase "does not overlap" may include "apart from" or "set aside from" or "offset from" and any other suitable equivalents as would be appreciated and understood by those of ordinary skill in the art.

When a certain embodiment may be implemented differently, a specific process order may be performed differently from the described order. For example, two consecutively described processes may be performed substantially at the same time or performed in an order opposite to the described order.

FIG. 1 is a schematic perspective view of a display apparatus 1 according to an embodiment.

Referring to FIG. 1, the display apparatus 1 may include an opening area OP (for example, a first area), a first display area DA1, and a second display area DA2 extended to the opening area OP. The first display area DA1 and the second display area DA2 may correspond to a second area that surrounds at least a portion of the opening area OP. The display apparatus 1 may provide a certain image by using light emitted from pixels disposed (e.g., arranged) in the first and second display areas DA1 and DA2. It is shown in FIG. 1 that one opening area OP may be disposed inside the first display area DA1, and the opening area OP may be entirely surrounded by the first display area DA1. The opening area OP may be an area where a component to be described later with reference to FIG. 2 may be disposed.

A second non-display area NDA2 as a third area may be disposed between the opening area OP and the first display area DA1 as the second area. In at least some embodiments, the second non-display area may be considered to be a peripheral area. The first display area DA1 may be surrounded by a first non-display area NDA1 as a fourth area. The first non-display area NDA1 may be extended to the second display area DA2. In other words, the second display area DA2 may be extended from an edge of the first non-display area NDA1 to an edge of the first display area DA1. The second non-display area NDA2 and the first non-display area NDA1 may be non-display areas where no pixels may be disposed. The second non-display area NDA2 may be entirely surrounded by the first display area DA1 and the second display area DA2, and the first display area DA1 may be entirely surrounded by the first non-display area NDA1.

Although an organic light-emitting display will now be illustrated and described as the display apparatus 1, the display apparatus 1 is not limited thereto. According to another embodiment, a different type of display apparatus, such as a quantum dot light-emitting display, may be used.

Although the single opening area OP may be included and may be approximately circular in FIG. 1, embodiments are not limited thereto. The number of opening areas OP may be two or more, and a shape of each of the opening areas OP may be any of various shapes such as a circular shape, an elliptical shape, a polygonal shape, a star shape, a diamond shape, and the like.

Figure 2:
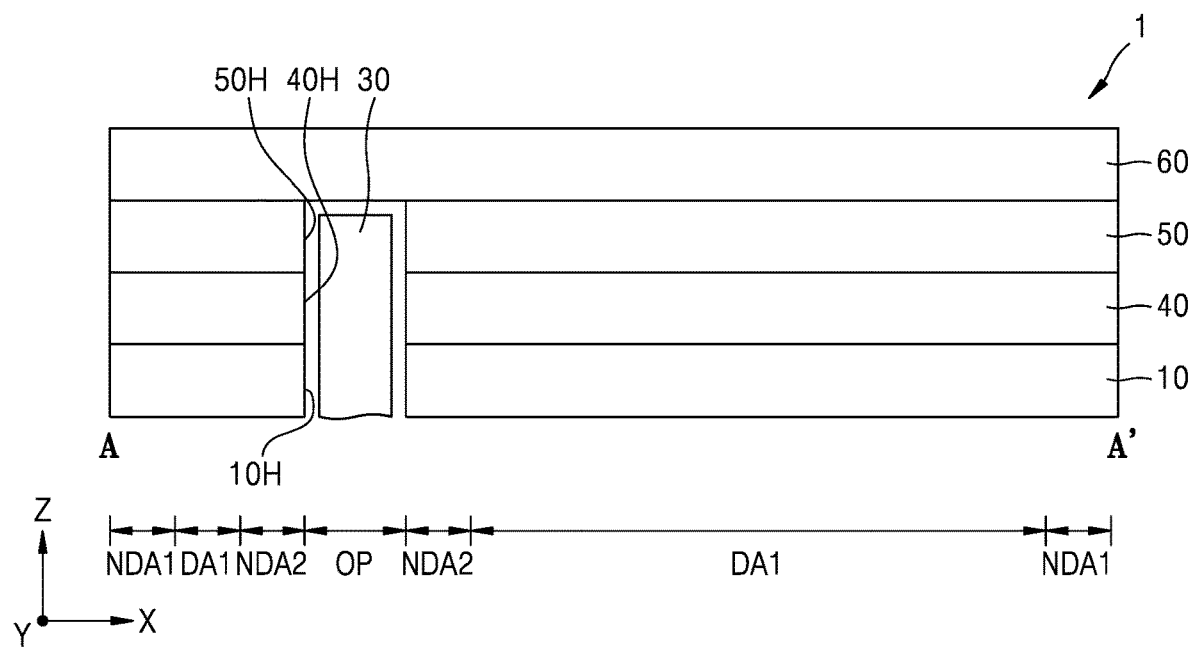
FIG. 2 is a schematic cross-sectional view of a display apparatus according to an embodiment.
Figure 3:
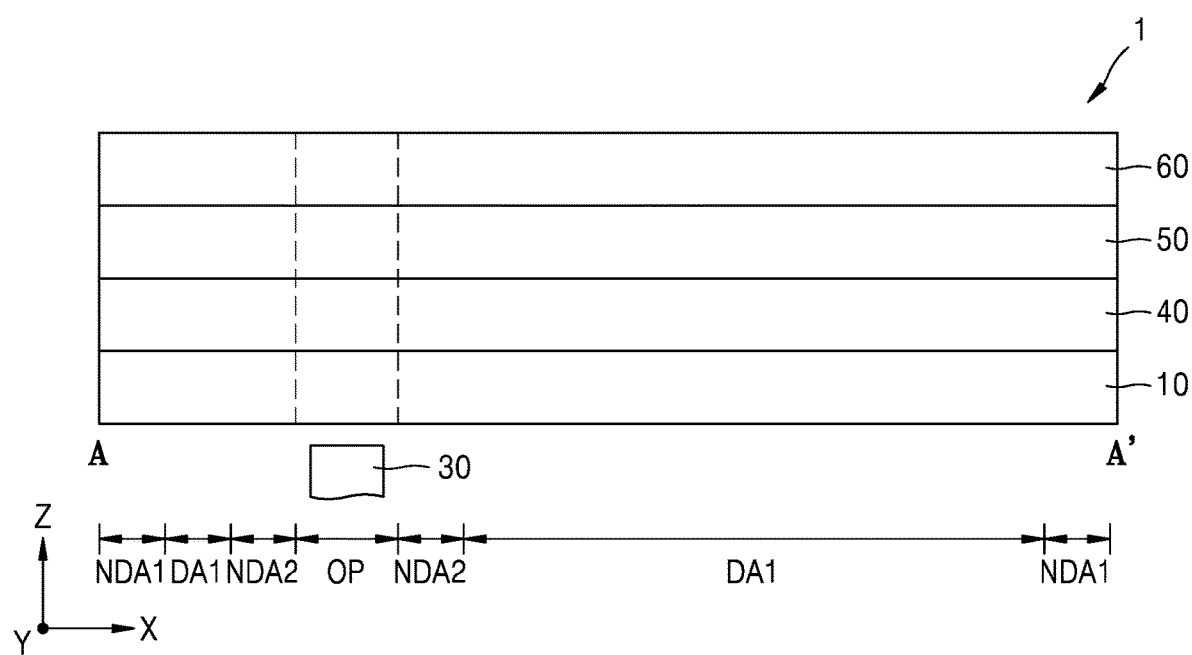
FIG. 3 is a schematic cross-sectional view of a display apparatus according to another embodiment.

FIG. 2 is a schematic cross-sectional view of a display apparatus 1 according to an embodiment. FIG. 3 is a schematic cross-sectional view of a display apparatus 1 according to another embodiment.

Referring to FIGS. 2 and 3, the display apparatus 1 may include a display panel 10, an input sensing layer 40, and an optical functional layer 50 disposed (e.g., sequentially) on the display panel 10. These layers may be covered by a window 60. The display apparatus 1 may be any of various electronic apparatuses such as mobile phones, notebook computers, and smartwatches.

The display panel 10 may display an image. The display panel 10 may include pixels disposed in the first display area DA1 and a second display area (not indicated). Each of the pixels may include a display element, and a pixel circuit connected to the display element. The display element may include an organic light-emitting diode, a quantum dot organic light-emitting diode, or the like.

The input sensing layer 40 may obtain coordinate information corresponding to an external input, for example, a touch event. The input sensing layer 40 may include a sensing electrode (or a touch electrode) and trace lines connected to the sensing electrode. The input sensing layer 40 may be disposed on the display panel 10. The input sensing layer 40 may sense an external input according to a mutual cap method and/or a self cap method.

The input sensing layer 40 may be formed on the display panel 10 (e.g., directly), or may be formed separately and coupled to the display panel 10 by using an adhesive layer such as an optical clear adhesive. For example, the input sensing layer 40 may be successively formed after a process of forming the display panel 10. The input sensing layer 40 may be understood as a portion of the display panel 10, and in an embodiment no adhesive layers may be disposed between the input sensing layer 40 and the display panel 10. FIG. 2 shows that the input sensing layer 40 may be between the display panel 10 and the optical functional layer 50. However, according to another embodiment, the input sensing layer 40 may be on the optical functional layer 50.

The optical functional layer 50 may include an anti-reflection layer. The anti-reflection layer may reduce reflectivity of light (external light) incident from an external source toward the display panel 10 through the window 60. The anti-reflection layer may include a phase retarder and a polarizer. The phase retarder may be of a film type or liquid coating type, and may include a $\lambda/2$ phase retarder and/or a $\lambda/4$ phase retarder. The polarizer may also be of a film type or liquid coating type. The film type may include a stretchable synthetic resin film, and the liquid coating type may include liquid crystals disposed in an arrangement. The phase retarder and the polarizer may further include protective films, respectively. The phase retarder and the polarizer or the protective films thereof may be defined as a base layer of the anti-reflection layer.

According to another embodiment, the anti-reflection layer may include a black matrix and color filters. The color filters may be disposed by taking into account the colors of light beams emitted by the pixels of the display panel 10. According to another embodiment, the anti-reflection layer may include a destructive interference structure. The destructive interference structure may include a first reflection layer and a second reflection layer disposed on different layers. First reflected light and second reflected light respectively reflected by the first reflection layer and the second reflection layer may be destructively interfered with each other, and thus the reflectance of external light may be reduced.

The optical functional layer 50 may include a lens layer. The lens layer may improve the emission efficiency or reduce color deviation of light emitted from the display panel 10. The lens layer may include a layer having a concave or convex lens shape, and/or include layers that may have different refractive indexes. The optical functional layer 50 may include both the anti-reflection layer and the lens layer, or include one of the anti-reflection layer and the lens layer.

According to an embodiment, the optical functional layer 50 may be successively formed after a process of forming the display panel 10 and/or the input sensing layer 40. In an embodiment, no adhesive layers may be disposed between the optical function layer 50 and the input sensing layer 40 and/or the display panel 10.

The display panel 10, the input sensing layer 40, and/or the optical functional layer 50 may include an opening. It is shown in FIG. 2 that the display panel 10, the input sensing layer 40, and the optical functional layer 50 may respectively include first, second, and third openings 10H, 40H, and 50H and that the first, second, and third openings 10H, 40H, and 50H may overlap each other. The first, second, and third openings 10H, 40H, and 50H may be located to correspond to the opening area OP. According to another embodiment, at least one from among the display panel 10, the input sensing layer 40, and the optical functional layer 50 may not include an opening. For example, one or two selected from the display panel 10, the input sensing layer 40, and the optical functional layer 50 may not include an opening. As shown in FIG. 3, the display panel 10, the input sensing layer 40, and the optical functional layer 50 may include no openings.

The opening area OP may be a kind of component area (e.g. a sensor area, a camera area, a speaker area, or the like) in which a component 30 for adding various functions to the display apparatus 1 may be located. As shown in FIG. 2, the component 30 may be located in the first, second, and third openings 10H, 40H, and 50H. As another example, as shown in FIG. 3, the component 30 may be located below the display panel 10.

The component 30 may include an electronic element. For example, the component 30 may be an electronic element that uses light or sounds. For example, the electronic element may include a sensor that outputs or/and receives light, like an infrared sensor, a camera that receives light and captures an image, a sensor that outputs and senses light or sound to measure a distance or recognize a fingerprint, a small lamp that outputs light, or a speaker that outputs sound. An electronic element using light may use light in various wavelength bands, such as visible light, infrared light, and ultraviolet light. According to some embodiments, the opening area OP may be understood as a transmission area capable of transmitting light or/and sound that may be output from the component 30 to the outside or travels from the outside toward the component 30.

According to another embodiment, in case that the display apparatus 1 may be used as a smartwatch or an instrument panel for automobiles, the component 30 may be a member such as a needle of a clock or a needle indicating information (e.g. a velocity of a vehicle). In case that the display apparatus 1 includes a needle of a clock or an instrument panel for automobiles, the component 30 may be exposed to the outside through the window 60, and the window 60 may include an opening corresponding to the opening area OP.

As described above, the component 30 may include an element(s) related to a function of the display panel 10 or may include an element such as an accessory that increases an esthetic sense of the display panel 10. Although not shown in FIGS. 2 and 3, a layer including an optical clear adhesive, etc. may be located between the window 60 and the optical functional layer 50.

Figure 4:
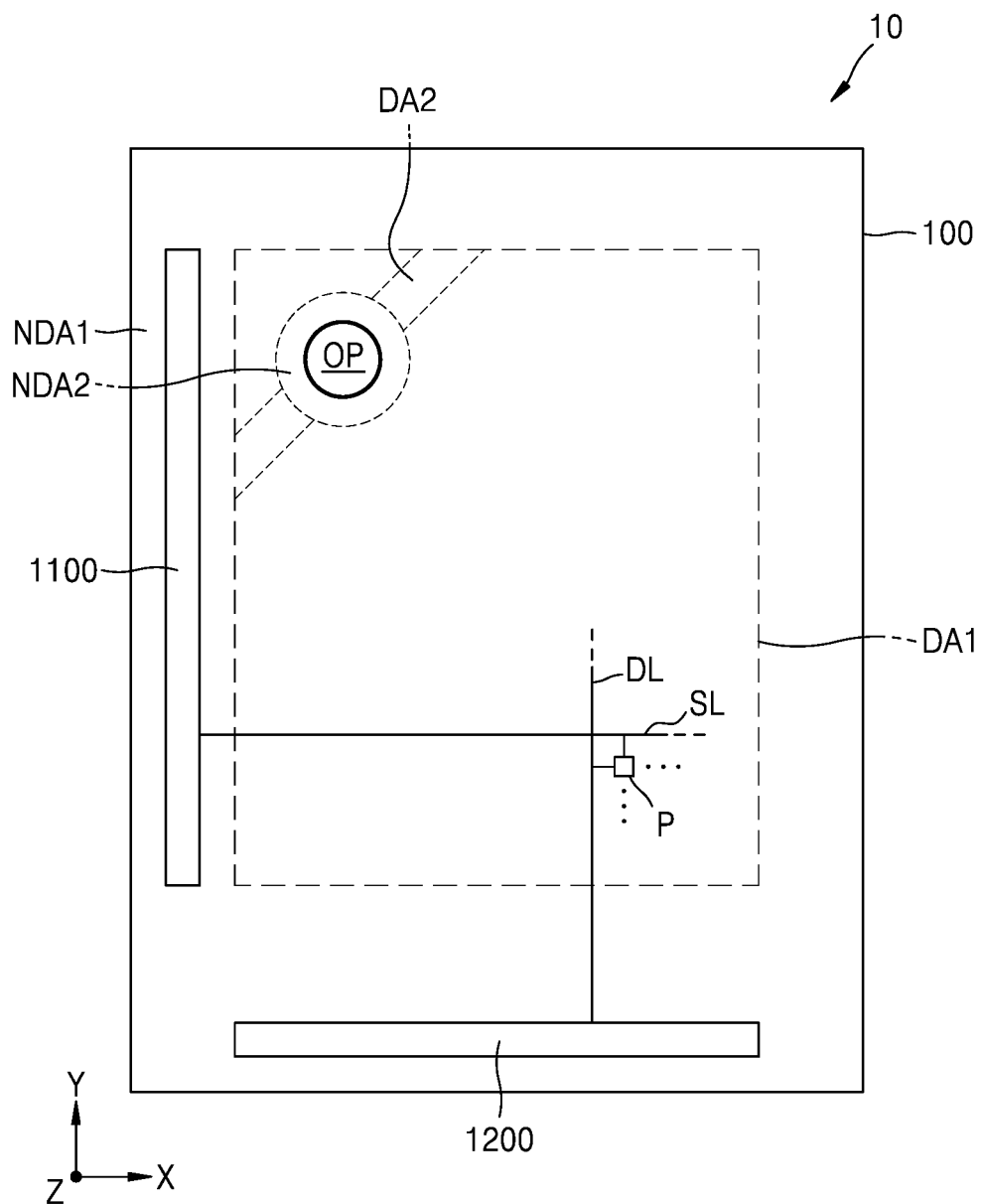
FIG. 4 is a schematic plan view of a display panel according to an embodiment.
Figure 5:
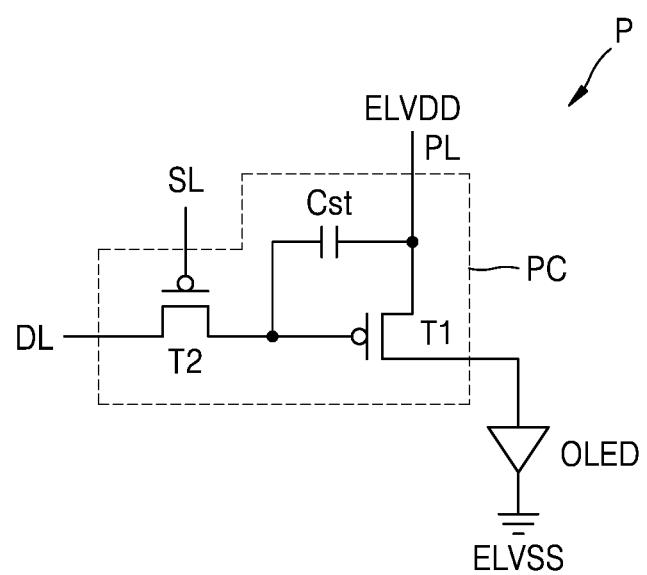
FIG. 5 is a schematic circuit diagram of a pixel in the display panel according to an embodiment.

FIG. 4 is a schematic plan view of a display panel 10 according to an embodiment. FIG. 5 is a schematic circuit diagram of a pixel in the display panel 10 according to an embodiment.

Referring to FIGS. 4 and 5, the display panel 10 may include the opening area OP as the first area, the first and second display areas DA1 and DA2 as the second area, the second non-display area NDA2 as the third area, and the first non-display area NDA1 as the fourth area.

The display panel 10 may include pixels P disposed in the first display area DA1 and the second display area DA2. A shown in FIG. 5, each of the pixels P may include a pixel circuit PC and an organic light-emitting diode OLED as a display element connected to the pixel circuit PC. The pixel circuit PC may include a first thin-film transistor T1, a second thin-film transistor T2, and a storage capacitor Cst. Each of the pixels P may emit, for example, red light, green light, or blue light, or may emit red light, green light, blue light, or white light, via the organic light-emitting diode OLED.

The second thin-film transistor T2, which may be a switching thin-film transistor, may be connected to a scan line SL and a data line DL, and transmit, to the first thin-film transistor T1, a data voltage received via the data line DL, based on a switching voltage received via the scan line SL. The storage capacitor Cst may be connected to the second thin-film transistor T2 and a driving voltage line PL, and may store a voltage corresponding to a difference between a voltage received from the second thin-film transistor T2 and a first power supply voltage ELVDD supplied to the driving voltage line PL.

The first thin-film transistor T1, which may be a driving thin-film transistor, may be connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness due to the driving current. An opposite electrode (for example, a cathode) of the organic light-emitting diode OLED may receive a second power supply voltage ELVSS.

Although a case where the pixel circuit PC includes two thin-film transistors and one storage capacitor is illustrated in FIG. 5, embodiments are not limited thereto. The number of thin-film transistors and the number of storage capacitors may vary according to a design of the pixel circuit PC. For example, the pixel circuit PC may further include four or more thin-film transistors in addition to the aforementioned two thin-film transistors.

In the first non-display area NDA1, a scan driver 1100 that may provide a scan signal to each of the pixels P, a data driver 1200 that may provide a data signal to each of the pixels P, and main power wires (not shown) that may provide first and second power supply voltages may be disposed. In FIG. 5, the data driver 1300 may be located on one edge of the substrate 100. However, according to another embodiment, the data driver 1200 may be located on a flexible printed circuit board (FPCB) electrically connected to a pad disposed on one side of the display panel 10.

For example, a wiring part may be disposed in the first non-display area NDA1 to provide various signals and/or power that may be applied to the first display area DA1 and the second display area DA2. The wiring part may include a driving circuit. For example, the driving circuit may include at least one of a scan driving circuit (not indicated), a terminal portion (not shown), a driving power supply line (not shown), and a second wire, and may further include a thin-film transistor for controlling an electrical signal that may be applied to the first display area DA1 and the second display area DA2. In the first non-display area NDA1, a partition wall, a trench, or the like for stopping flow of an organic layer that may be used in manufacturing the display apparatus may also be disposed.

Referring back to FIG. 4, the second non-display area NDA2 may surround the opening area OP according to a planar view. The second non-display area NDA2 and the opening area OP may be areas in which a display element such as an organic light-emitting diode may not be disposed.

Signal lines that may provide signals to pixels P disposed around the opening area OP may traverse the second non-display area NDA2.

Although not shown in the drawings, a special groove, in addition to the signal lines, may be disposed in the second non-display area NDA2. Grooves may be included, and the grooves may be spaced apart from each other in the second non-display area NDA2.

Figure 6:
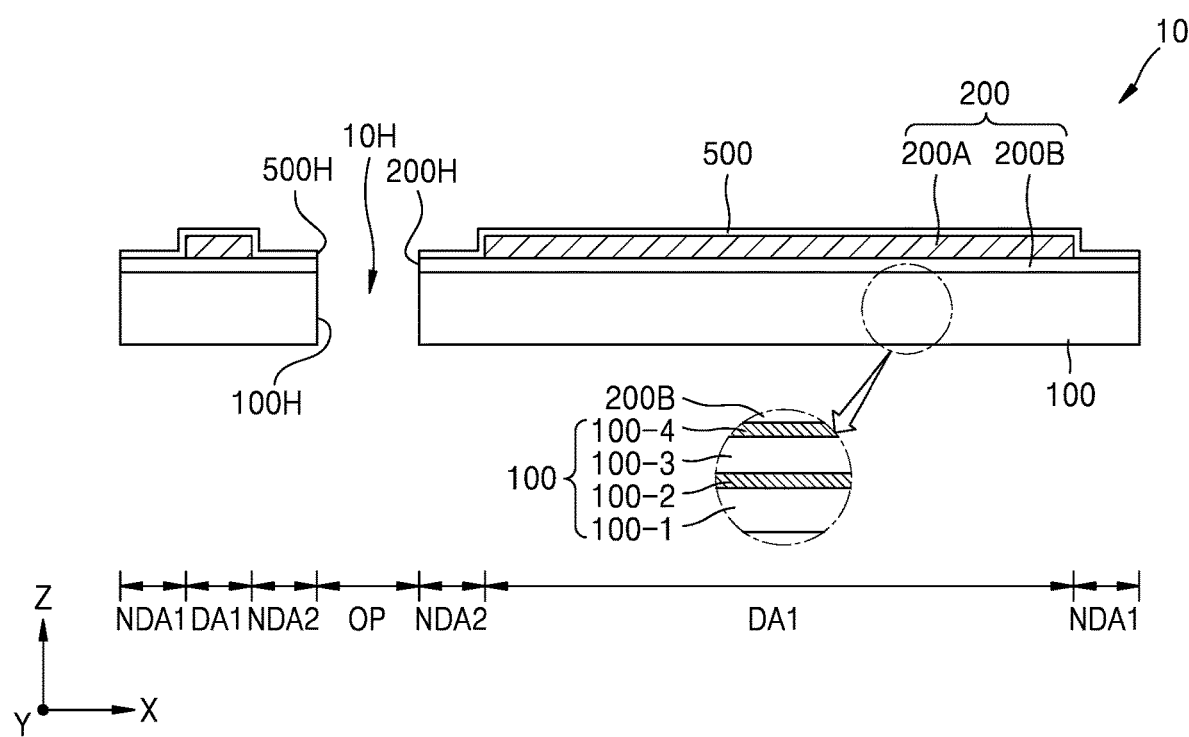
FIG. 6 is a schematic cross-sectional view of a display panel according to an embodiment.
Figure 7:
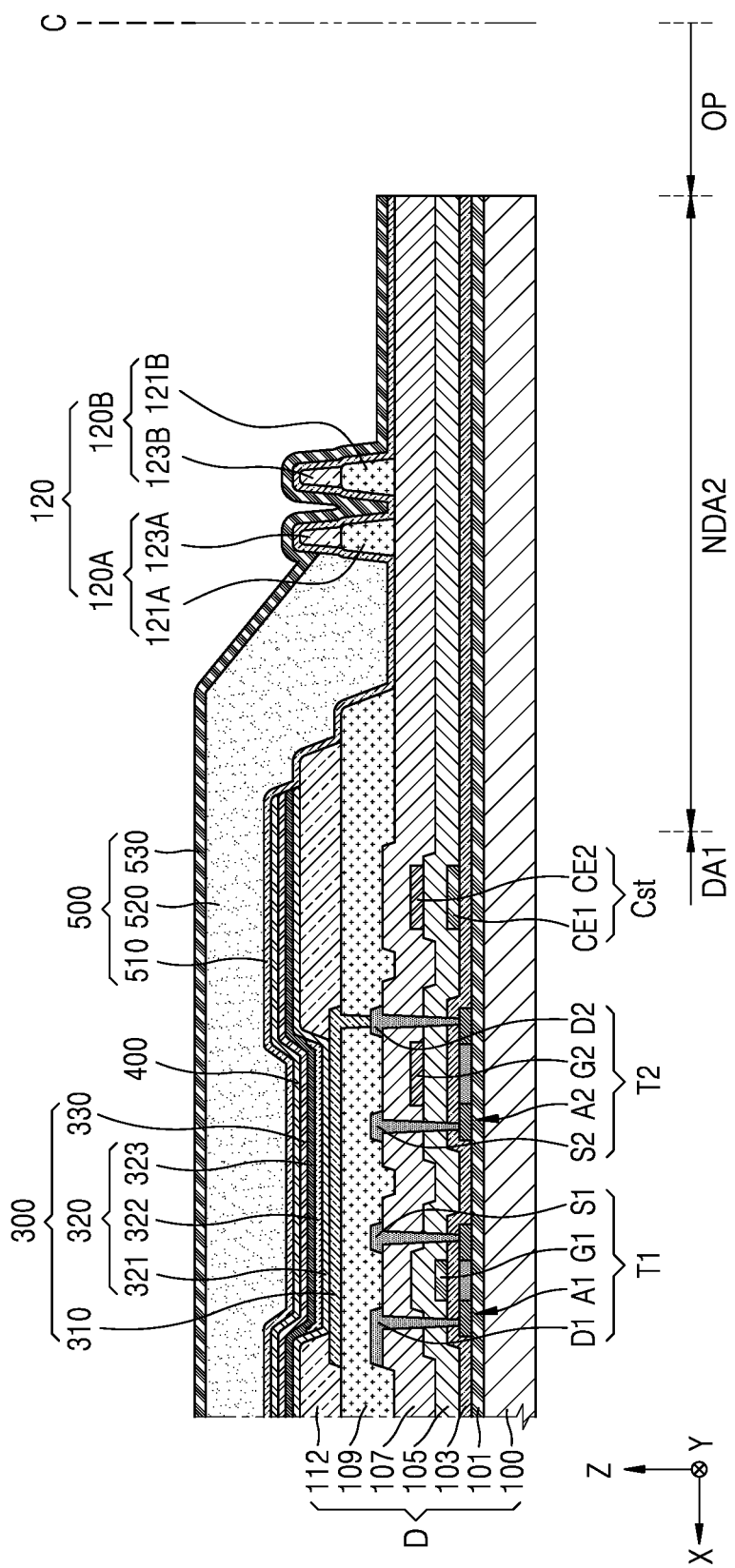
FIG. 7 is a schematic cross-sectional view illustrating a first display area of the display panel of FIG. 4.
Figure 8:
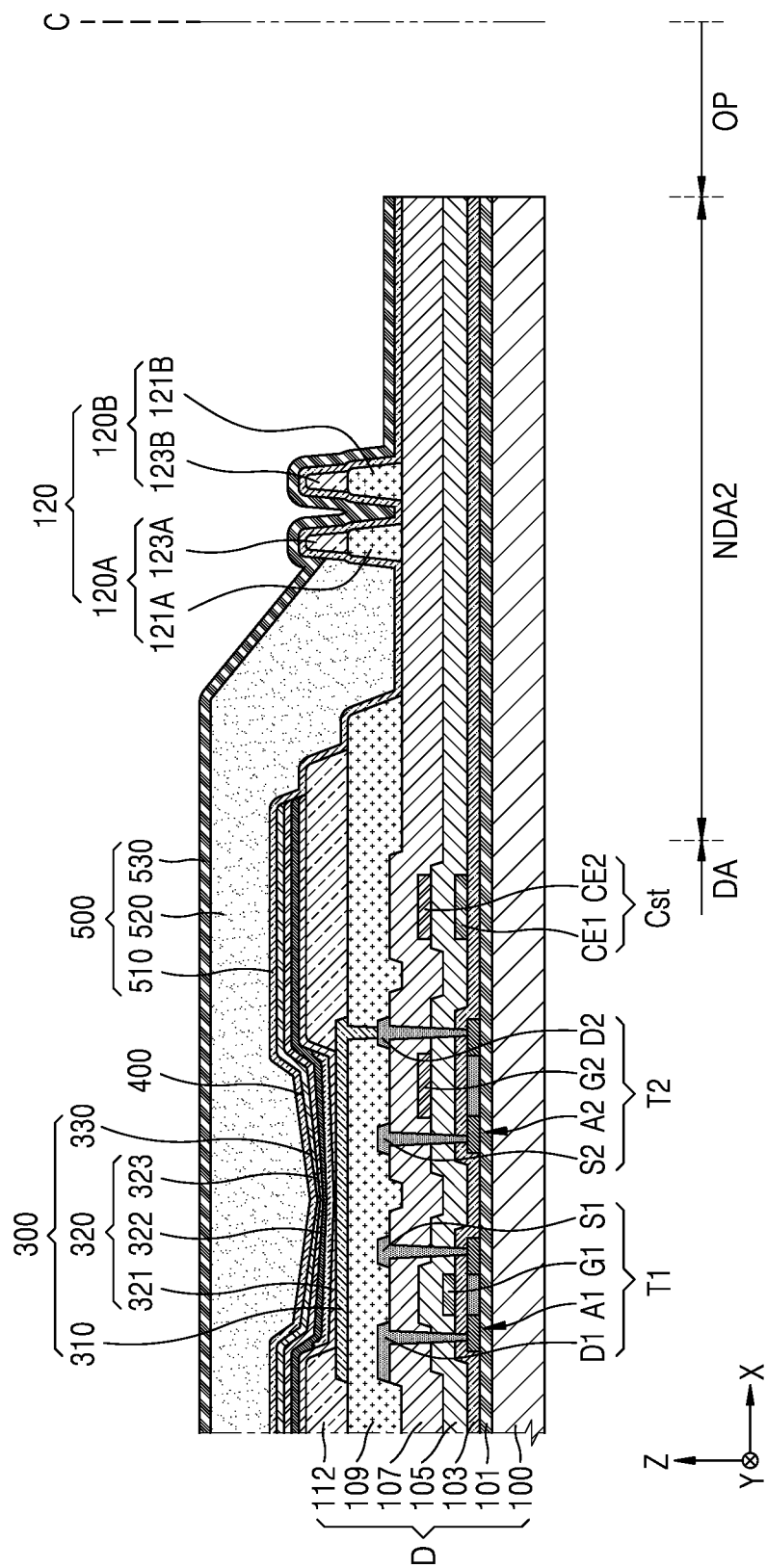
FIG. 8 is a schematic cross-sectional view illustrating a second display area of the display panel of FIG. 4.

FIG. 6 is a schematic cross-sectional view of a display panel according to an embodiment. FIG. 7 is a schematic cross-sectional view illustrating a first display area of the display panel 10 of FIG. 4. FIG. 8 is a schematic cross-sectional view illustrating a second display area of the display panel 10 of FIG. 4.

Referring to FIGS. 6 through 8, the display panel 10 includes a display layer 200 disposed on a substrate 100. The display layer 200 may be disposed on the first display area DA1 and the second display area DA2.

The substrate 100 may include a glass material or may include a polymer resin. The substrate 100 may have a multi-layer structure. For example, as shown in an enlarged view of FIG. 6, the substrate 100 may include a first base layer 100-1, a first barrier layer 100-2, a second base layer 100-3, and a second barrier layer 100-4.

Each of the first and second base layers 100-1 and 100-3 may include a polymer resin. For example, the first and second base layers 100-1 and 100-3 may include a polymer resin such as polyethersulphone, polyacrylate, polyetherimide, polyethylene naphthalate, polyethylene terephthalate, polyphenylene sulfide, polyarylate, polyimide, polycarbonate, cellulose acetate propionate, or a combination thereof. The aforementioned polymer resins may be transparent.

Each of the first and second barrier layers 100-2 and 100-4 may be a barrier layer that may prevent infiltration of external foreign materials, and thus may be a single layer or multiple layers including an inorganic material, such as silicon nitride (SiNx) or silicon oxide (SiOx).

The display layer 200 may include pixels. The display layer 200 may include a display element layer 200A and a pixel circuit layer 200B. The display element layer 200A may include display elements respectively disposed in the pixels, and the pixel circuit layer 200B may include insulating layers and a pixel circuit disposed in each pixel. Each pixel circuit may include a thin-film transistor and a storage capacitor, and each display element may include an organic light-emitting diode OLED.

The display elements of the display layer 200 may be covered by an encapsulation member such as a thin-film encapsulation layer 500. The thin-film encapsulation layer 500 may include at least one inorganic encapsulation layer and at least one organic encapsulation layer. In case that the display panel 10 includes the substrate 100 including a polymer resin, and the thin-film encapsulation layer 500 including an inorganic encapsulation layer and an organic encapsulation layer, flexibility of the display panel 10 may be improved.

The display panel 10 may include the first opening 10H that may penetrate through the display panel 10. The first opening 10H may be located in the opening area OP. The opening area OP may be a kind of opening area. It is shown in FIG. 6 that the substrate 100 and the thin-film encapsulation layer 500 respectively include through holes 100H and 500H, each corresponding to the first opening 10H of the display panel 10. The display layer 200 may include a through hole 200H corresponding to the opening area OP.

The display panel 10 may include the substrate 100 including the first display area DA1, the second display area DA2, and a non-display area, and the thin-film encapsulation layer 500 encapsulating the first display area DA1, the second display area DA2, and the non-display area. As described above, the display panel 10 may include the display layer 200 and the thin-film encapsulation layer 500.

A buffer layer 101 may be disposed (e.g., positioned) on the substrate 100 and may reduce or prevent infiltration of a foreign material, moisture, or ambient air from below the substrate 100 and may provide a flat surface on the substrate 100. The buffer layer 101 may include an inorganic material (such as oxide or nitride), an organic material, or an organic and inorganic compound, and may be formed as a single layer or multiple layers of an inorganic material and an organic material.

A first thin-film transistor T1 may include a semiconductor layer A1, a first gate electrode G1, a source electrode S1, and a drain electrode D1, and the second thin-film transistor T2 may include a semiconductor layer A2, a second gate electrode G2, a source electrode S2, and a drain electrode D2.

A case where the first and second thin-film transistors T1 and T2 may be of a top gate type will now be illustrated and described. However, embodiments are not limited thereto, and various types of thin-film transistors, such as a bottom gate type thin-film transistor, may be employed.

Although the two thin-film transistors T1 and T2 are illustrated hereinafter, embodiments are not limited thereto. In embodiments, a display apparatus may employ at least two thin-film transistors T1 and T2 for a single pixel. In some embodiments, various modifications may be made to the first and second thin-film transistors T1 and T2. For example, six or seven thin-film transistors may be employed for a single pixel.

The semiconductor layers A1 and A2 may include amorphous silicon or polycrystalline silicon. According to another embodiment, the semiconductor layers A1 and A2 may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layers A1 and A2 may include a channel region, and a source region and a drain region each having a higher carrier concentration than the channel region.

The first gate electrode G1 may be disposed on the semiconductor layer A1 with a first gate insulating layer 103 therebetween. The first gate electrode G1 may include molybdenum (Mo), aluminum (Al), copper (Cu), titanium (Ti), or a combination thereof, and may be a single layer or multiple layers. For example, the first gate electrode G1 may be a single layer of Mo.

The first gate insulation layer 103 may insulate the semiconductor layer A1 from the first gate electrode G1, and may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The second gate electrode G2 may be disposed on the semiconductor layer A2 with the first gate insulating layer 103 and a second gate insulating layer 105 therebetween. The second gate electrode G2 may include a conductive material including, for example, molybdenum (Mo), aluminum (Al), copper (Cu), titanium (Ti), or a combination thereof, and may be formed as a multi-layer or single layer including the aforementioned materials. For example, the second gate electrode G2 may be a single layer of Mo or a multi-layer of Mo/Al/Mo.

The second gate insulating layer 105 may include an inorganic material including oxide or nitride. For example, the second gate insulating layer 105 may include $SiO_2$, $SiN_x$, SiON, $Al_2O_3$, $TiO_2$, $Ta_2O_5$, $HfO_2$, $ZnO_2$, or the like.

The source electrodes S1 and S2 and the drain electrodes D1 and D2 may be disposed on an interlayer insulating layer 107. Each of the source electrodes S1 and S2 and the drain electrodes D1 and D2 may include a conductive material including Mo, Al, Cu, Ti, or a combination thereof, and may be a multi-layer or single layer including the aforementioned materials. For example, each of the source electrodes S1 and S2 and the drain electrodes D1 and D2 may be formed as a multi-layer of Ti/Al/Ti.

The interlayer insulating layer 107 may include silicon oxide ($SiO_x$), $SiN_x$, SiON, $Al_2O_3$, $TiO_2$, $Ta_2O_5$, $HfO_2$, $ZnO_2$, or the like.

As described above, the first gate electrode G1 of the first thin-film transistor T1 and the second gate electrode G2 of the second thin-film transistor T2 may be disposed on different layers. Accordingly, driving ranges of the first thin-film transistor T1 and the second thin-film transistor T2 may be differently controlled.

A first electrode CE1 of a storage capacitor Cst and the first gate electrode G1 may be formed on a same layer. The first electrode CE1 of the storage capacitor Cst and the first gate electrode G1 may include a same material. A second electrode CE2 of the storage capacitor Cst may overlap the first electrode CE1 with the second gate insulating layer 105 therebetween. The second electrode CE2 and the second gate electrode G2 may be formed on a same layer, and may include a same material.

In FIGS. 7 and 8, the storage capacitor Cst does not overlap the first thin-film transistor T1 and the second thin-film transistor T2. However, embodiments are not limited thereto. For example, the storage capacitor Cst may overlap the first thin-film transistor T1. In some embodiments, the first electrode CE1 of the storage capacitor Cst may be integrally formed with the first gate electrode G1. For example, the first gate electrode G1 of the first thin-film transistor T1 may function as the first electrode CE1 of the storage capacitor Cst.

A planarization layer 109 may be disposed on the source electrodes S1 and S2 and the drain electrodes D1 and D2, and an organic light-emitting diode (OLED) 300 may be disposed on the planarization layer 109. The planarization layer 109 may be a single layer including an organic material or a multi-layer formed by stacking single layers including an organic material. The organic material may include a commercial polymer such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 109 may be a complex stack of an inorganic insulation layer and an organic insulation layer.

The OLED 300 may be disposed on the planarization layer 109 in the first display area DA1 and the second display area DA2 of the substrate 100. The OLED 300 may include a common layer. The common layer may be a layer that may be commonly formed in the first display area DA1 and the second display area DA2. For example, the common layer may include at least one of the layers included in an intermediate layer 320 (for example, one of the remaining layers except for an emission layer 322 from among the layers included in the intermediate layer 320) and an opposite electrode 330. The OLED 300 may include a pixel electrode 310, an opposite electrode 330, and the intermediate layer 320 between the pixel electrode 310 and the opposite electrode 330.

The pixel electrode 310 may contact one of the source electrode S1 and the drain electrode D1 of the first thin-film transistor T1 via an opening formed in the planarization layer 109, and may be electrically connected to the first thin-film transistor T1. The pixel electrode 310 may be a reflection electrode. For example, the pixel electrode 310 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

A pixel defining layer 112 may be disposed on the planarization layer 109. The pixel defining layer 112 defines pixels by including respective openings corresponding to sub-pixels, namely, an opening via which a center portion of at least the pixel electrode 310 may be exposed. The pixel defining layer 112 may prevent an arc from occurring on the edge of the pixel electrode 310 by increasing a distance between the edge of the pixel electrode 310 and the opposite electrode 330 disposed over the pixel electrode 310. The pixel defining layer 112 may be formed of an organic material, for example, polyimide or hexamethyldisiloxane (HMDSO).

The intermediate layer 320 may include the emission layer 322. The emission layer 322 may include an organic material including a fluorescent or phosphorescent material that may emit, e.g., red light, green light, and blue light, and may be patterned in accordance with the pixels P in the first display area DA1 and the second display area DA2. The intermediate layer 320 may include at least one functional layer from among a first functional layer 321 between the emission layer 322 and the pixel electrode 310, and a second functional layer 323 between the emission layer 322 and the opposite electrode 330.

The first functional layer 321 may include a hole injection layer (HIL) and/or a hole transport layer (HTL).

The HIL may allow an anode to easily emit holes, and the HTL may allow the holes of the HIL to be delivered to the emission layer.

The HIL may include, but is not limited to, a phthalocyanine compound (such as copper phthalocyanine), DNTPD (N,N'-diphenyl-N,N'-bis-[4-(phenyl-m-tolyl-amino)-phenyl]-biphenyl-4,4'-diamine), m-MTDATA (4,4',4"-tris (3-methylphenylphenylamino) triphenylamine), TDATA (4,4'4"-Tris (N,N-diphenylamino) triphenylamine), 2T-NATA (4,4',4"-tris {N,-(2-naphthyl)-N-phenylamino}-triphenylamine), PEDOT/PSS (Poly (3,4-ethylenedioxythiophene))/Poly (4-styrenesulfonate)), Pani/DBSA (Polyaniline/Dodecylbenzenesulfonic acid), Pani/CSA (Polyaniline/Camphor sulfonicacid), PANI/PSS (Polyaniline/Poly (4-styrenesulfonate), or the like.

The HTL may include, but is not limited to, triphenylamine-based materials such as carbazole derivatives (such as N-phenylcarbazole and polyvinylcarbazole), TPD (N,N'-bis (3-methylphenyl)-N,N'-diphenyl-[1,1-biphenyl]-4,4'-diamine), NPB (N,N'-di(1-naphthyl)-N,N'-diphenylbenzidine), TCTA (4,4',4"-tris(N-carbazolyl)triphenylamine), or a combination thereof.

The second functional layer 323 may include an electron transport layer (ETL) and/or an electron injection layer (EIL).

The EIL may allow a cathode to easily emit electrons, and the ETL may allow the electrons of the EIL to be delivered to the emission layer.

The ETL may include, but is not limited to, Alq3, BCP (2,9-Dimethyl-4,7-diphenyl-1,10-phenanthroline), Bphen (4,7-Diphenyl-1,10-phenanthroline), TAZ (3-(4-Biphenylyl)-4-phenyl-5-tert-butylphenyl-1,2,4-triazole), NTAZ (4-(Naphthalen-1-yl)-3,5-diphenyl-4H-1,2,4-triazole), tBu-PBD (2-(4-Biphenylyl)-5-(4-tert-butylphenyl)-1,3,4-oxadiazole), BAlq (Bis(2-methyl-8-quinolinolato-N1,O8)-(1,1'-Biphenyl-4-olato)aluminum), Bebq2 (beryllium bis (benzoquinolin-10-olate)), ADN (9,10-di(naphthalene-2-yl) anthrascene), or a combination thereof.

The EIL may include, but is not limited to, LiF, NaCl, CsF, Li2O, BaO, Liq, or a combination thereof.

The intermediate layer 320 is not limited to the structure described above, and may have any of various other structures. The intermediate layer 320 may include a single layer that may cover pixel electrodes 310 or may include patterned layers respectively corresponding to the pixel electrodes 310. For convenience of explanation, a case where the emission layer 322 may be patterned to correspond to each of the pixel electrodes 310 and the first functional layer 321 and the second functional layer 323 may be disposed on the substrate 100 to cover the pixel electrodes 310 will now be described.

The opposite electrode 330 may be over the first and second display areas DA1 and DA2. As illustrated in FIGS. 7 and 8, the opposite electrode 330 may cover the first and second display areas DA1 and DA2. In other words, the opposite electrode 330 may be formed as a single body constituting OLEDs 300, and thus may correspond to the pixel electrodes 310. According to another embodiment, the opposite electrode 330 may extend over the first display area DA1, the second display area DA2, and a portion of a non-display area. For convenience of explanation, a case where the opposite electrode 330 may extend over the first display area DA1, the second display area DA2, and a portion of a non-display area will now be described.

The opposite electrode 330 may be a transparent electrode. The opposite electrode 330 may be a transparent or semi-transparent electrode, and may be a metal thin film having a small work function, including Li, Ca, LiF/Ca, LiF/Al, Al, Ag, Mg, or a combination thereof. A transparent conductive oxide (TCO) layer including, for example, ITO, IZO, ZnO, or In$_2$O$_3$, may be further disposed on the metal thin film.

As the pixel electrode 310 may be a reflection electrode and the opposite electrode 330 may be a transparent electrode, the display apparatus may be of a top-emission type in which light emitted by the intermediate layer 320 may be emitted toward the opposite electrode 330. However, embodiments are not limited thereto, and the display apparatus may be a bottom-emission type in which the light emitted by the organic emission layer may be emitted toward the substrate 100. The pixel electrode 310 may be a transparent or semi-transparent electrode, and the opposite electrode 330 may be a reflection electrode. The display apparatus according to an embodiment may be of a dual emission type that emits light in both directions, namely, toward the top surface and the bottom surface of the display apparatus.

A capping layer 400 may be disposed on the opposite electrode 330. The capping layer 400 may contact (e.g., directly contact) the opposite electrode 330. The capping layer 400 may have a lower refractive index than the opposite electrode 330 and may have a higher refractive index than a first inorganic encapsulation layer 510. The capping layer 400 may improve luminescent efficiency by increasing a percentage that light generated by the intermediate layer 320 including the emission layer 322 may be totally reflected and thus may be not emitted to the outside of the display panel 10.

The thickness of a first common layer disposed in the first display area DA1 and the thickness of a second common layer disposed in the second display area DA2 may be different from each other. For example, the thickness of one of the first functional layer 321, the emission layer 322, the second functional layer 323, the opposite electrode 330, or the capping layer 400 may be different in the first display area DA1 and the second display area DA2 of FIG. 4. For example, the thickness of one of the first functional layer 321, the emission layer 322, the second functional layer 323, the opposite electrode 330, or the capping layer 400 disposed in the first display area DA1 may be greater than that of one of the first functional layer 321, the emission layer 322, the second functional layer 323, the opposite electrode 330, or the capping layer 400 disposed in the second display area DA2. In particular, one of the first functional layer 321, the emission layer 322, the second functional layer 323, the opposite electrode 330, or the capping layer 400 disposed in the first display area DA1 may be formed of a deposition material completely having passed through an opening of a mask which will be described later, whereas one of the first functional layer 321, the emission layer 322, the second functional layer 323, the opposite electrode 330, or the capping layer 400 disposed in the second display area DA2 may be formed of a deposition material partially or selectively blocked by the ribs of the mask.

The thickness of one of the first functional layer 321, the emission layer 322, the second functional layer 323, the opposite electrode 330, or the capping layer 400 disposed in the second display area DA2 may differ in a width direction of the second display area DA2. The width direction of the second display area DA2 may be a direction in between the X axis and the Y axis of FIG. 4. In particular, a width of the second display area DA2 may be measured in a direction perpendicular to the edge of the second display area DA2. The thickness of one of the first functional layer 321, the emission layer 322, the second functional layer 323, the opposite electrode 330, or the capping layer 400 disposed in the second display area DA2 may be smallest at an arbitrary point in the width direction of the second display area DA2. The thickness of one of the first functional layer 321, the emission layer 322, the second functional layer 323, the opposite electrode 330, or the capping layer 400 disposed in the second display area DA2 may linearly increase in a direction from a point in the second display area DA2 where the thickness of one of the first functional layer 321, the emission layer 322, the second functional layer 323, the opposite electrode 330, or the capping layer 400 disposed in the width direction of the second display area DA2 may be the smallest to the edge of the second display area DA2. In particular, the thickness of one of the first functional layer 321, the emission layer 322, the second functional layer 323, the opposite electrode 330, or the capping layer 400 disposed on the edge of the second display area DA2 may be equal to or greatly similar to that of one of the first functional layer 321, the emission layer 322, the second functional layer 323, the opposite electrode 330, or the capping layer 400 disposed in the first display area DA1. The point in the second display area DA2 where the thickness of one of the first functional layer 321, the emission layer 322, the second functional layer 323, the opposite electrode 330, or the capping layer 400 may be smallest may be the center of the width of the second display area DA2. In other words, the thickness of one of the first functional layer 321, the emission layer 322, the second functional layer 323, the opposite electrode 330, or the capping layer 400 may increase in a direction from the center of the width of the second display area DA2 to the edge of the second display area DA2.

The thin-film encapsulation layer 500 may cover the first and second display areas DA1 and D2 and the non-display area to prevent infiltration of external moisture and oxygen. The thin-film encapsulation layer 500 may include at least one organic encapsulation layer and at least one inorganic encapsulation layer. Although the thin-film encapsulation layer 500 may include two inorganic encapsulation layers, namely, first and second inorganic encapsulation layers 510 and 530, and a single organic encapsulation layer 520 in FIGS. 7 and 8, the order in which the layers 510 through 530 are stacked and the number of times the layers 510 through 530 may be stacked are not limited to the embodiment of FIGS. 7 and 8.

The first inorganic encapsulation layer 510 may cover the opposite electrode 330 and may include a silicon oxide, a silicon nitride, and/or a silicon oxynitride. As necessary, other layers, such as, the capping layer 400, may be between the first inorganic encapsulation layer 510 and the opposite electrode 330, as described above. Because the first inorganic encapsulation layer 510 may be formed along structures below the first inorganic encapsulation layer 510, the upper surface thereof may not be flat, as shown in FIGS. 7 and 8.

The organic encapsulation layer 520 may cover the first inorganic encapsulation layer 510. In contrast with the first inorganic encapsulation layer 510, the organic encapsulation layer 520 may have an approximately flat upper surface. In detail, the organic encapsulation layer 520 may have an approximately flat upper surface at a portion corresponding to the first display area DA1. The organic encapsulation layer 520 may include at least one material from among polyethylene terephthalate, polyethylene naphthalate, polycarbonate, polyimide, polyethylene sulfonate, polyoxymethylene, polyarylate, and hexamethyldisiloxane. The second inorganic encapsulation layer 530 may cover the organic encapsulation layer 520 and may include a silicon oxide, a silicon nitride, and/or a silicon oxynitride.

As such, since the thin-film encapsulation layer 500 may include the first inorganic encapsulation layer 510, the organic encapsulation layer 520, and the second inorganic encapsulation layer 530, even in case that the thin-film encapsulation layer 500 may crack, due to this multi-layer structure, this crack may not be extended between the first inorganic encapsulation layer 510 and the organic encapsulation layer 520 or between the organic encapsulation layer 520 and the second inorganic encapsulation layer 530. Accordingly, formation of a path via which external moisture, oxygen, or the like permeates into the first and second display areas DA1 and DA2 and the non-display area may be prevented or minimized. An edge of the second inorganic encapsulation layer 530 outside the first and second display areas DA1 and DA2 may contact the first inorganic encapsulation layer 510 so that the organic encapsulation layer 520 may not be exposed to the outside.

A partition wall 120 may be disposed in the non-display area of the substrate 100.

The partition wall 120 may block an organic material from flowing toward the edge of the substrate 100 in case that the organic encapsulation layer 520 of the thin-film encapsulation layer 500 for encapsulating the first display area DA1 and the non-display area may be formed, thereby preventing formation of an edge tail of the organic encapsulation layer 520.

One or more partition walls 120 may be included. In case that multiple partition walls 120 are included, the partition walls 120 may include a first partition wall 120A and a second partition wall 120B spaced apart from each other.

At least one of the first partition wall 120A and the second partition wall 120B may be formed as layers. In FIG. 7, the first partition wall 120A is illustrated as a stack of a first layer 121A and a second layer 123A. The first layer 121A and the planarization layer 109 may include or be formed of a same material, and the second layer 123A and the pixel defining layer 112 may include or be formed of a same material. The second partition wall 120B is illustrated as a stack of a first layer 121B and a second layer 123B. The first layer 121B and the planarization layer 109 may include or be formed of a same material, and the second layer 123B and the pixel defining layer 112 may include or be formed of a same material. However, embodiments are not limited thereto. One of the first partition wall 120A and the second partition wall 120B may be a single layer or each of them may have a double-layer structure or a three-layer structure. In this way, various modifications may be made to the structures of the first and second partition walls 120A and 120B. An additional partition wall spaced apart from the first partition wall 120A and the second partition wall 120B may be further included.

Although not shown in FIGS. 7 and 8, a spacer may be disposed on a flat portion of the pixel defining layer 112, and may protrude from the flat surface of the pixel defining layer 112 to the thin-film encapsulation layer 500. The spacer may be formed of an organic material, for example, polyimide or hexamethyldisiloxane (HMDSO).

As the partition wall 120 may include multiple partition walls, overflow of the organic material in case that the organic encapsulation layer 520 may be formed may be more effectively prevented.

FIG. 9 is a schematic cross-sectional view of a display panel 10' according to another embodiment.

Referring to FIG. 9, a substrate 100 may not include a through hole corresponding to the opening area OP. A display layer 200 may include a through hole 200H corresponding to the opening area OP. The thin-film encapsulation layer 500 may not include a through hole corresponding to the opening area OP. The opening area OP may not include the above-described insulating layers.

The display panel 10 may include the first display area DA1, the second display area DA2, the first non-display area NDA1, and the second non-display area NDA2. Because the first display area DA1, the second display area DA2, the first non-display area NDA1, and the second non-display area NDA2 may be the same as or similar to those described above with reference to FIGS. 1 through 8, detailed descriptions thereof will be omitted here.

FIG. 10 is a schematic cross-sectional view of a display panel 10 according to another embodiment.

Referring to FIG. 10, the display layer 200 may not include the through hole 200H corresponding to the opening area OP, and the display element layer 200A may not be located in the opening area OP. The pixel circuit layer 200B included in the display layer 200 or the insulating layers included in the pixel circuit layer 200B may be disposed in the opening area OP. According to another embodiment, no special layers may be disposed in the opening area OP, in addition to the substrate 100.

The display panel 10 may include the first display area DA1, the second display area DA2, the first non-display area NDA1, and the second non-display area NDA2. Because the first display area DA1, the second display area DA2, the first non-display area NDA1, and the second non-display area NDA2 are the same as or similar to those described above with reference to FIGS. 1 through 8, detailed descriptions thereof will be omitted here.

Figure 11:
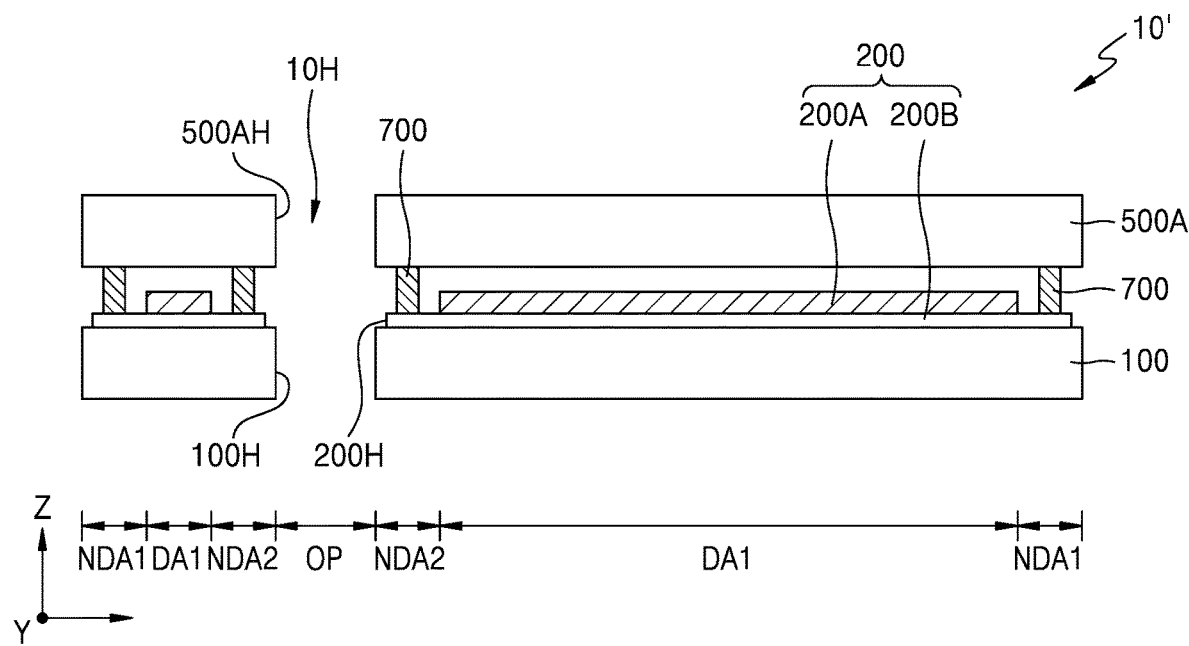
FIG. 11 is a schematic cross-sectional view of a display panel according to another embodiment.
Figure 12:
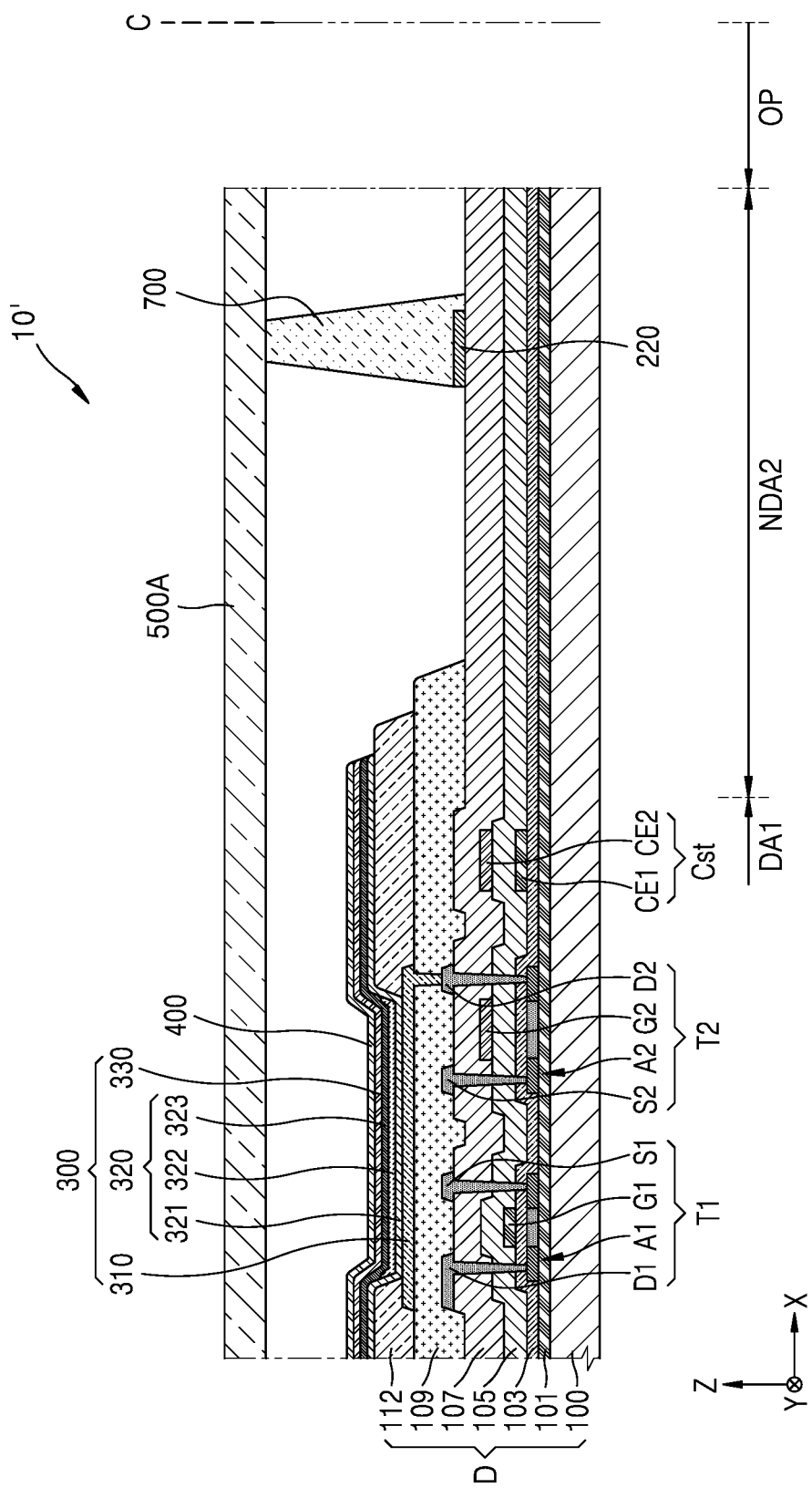
FIG. 12 is a schematic cross-sectional view of the display panel of FIG. 11.

FIG. 11 is a schematic cross-sectional view of a display panel 10' according to another embodiment. FIG. 12 is a schematic cross-sectional view of the display panel 10' of FIG. 11.

Referring to FIGS. 11 and 12, unlike the above-described display panel 10' that may include the thin-film encapsulation layer 500, the display panel 10' of FIGS. 11 and 12 may include an encapsulation substrate 500A and a sealing part 700.

At least one of the substrate 100, the display layer 200, and the encapsulation substrate 500A may include through holes 100H, 200H, and 500AH corresponding to the opening area OP. The display element layer 200A may not be disposed in the opening area OP.

The substrate 100 may include glass or polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate 100 may have a multi-layered structure including a layer including the aforementioned polymer resin and an inorganic layer (not shown). For convenience of description, a case where the substrate 100 may be formed of glass will now be described.

The sealing part 700 may be between the substrate 100 and the encapsulation substrate 500A. The sealing part 700 may be disposed in the opening area OP and the second non-display area NDA2. The sealing part 700 may be disposed in the second non-display area NDA2, and the sealing part 700 disposed in the second non-display area NDA2 may surround (e.g., completely surround) the opening area OP.

The encapsulation substrate 500A may face the substrate 100. The encapsulation substrate 500A and the substrate 100 may be formed of a same or similar material. In particular, the encapsulation substrate 500A may be formed of glass. According to another embodiment, the encapsulation substrate 500A may include plastic. The encapsulation substrate 500A may include one or more layers including one or more resins.

A dummy wire may be disposed in the first non-display area NDA1 and the second non-display area NDA2 while the source electrodes S1 and S2 and/or the drain electrodes D1 and D2 are being manufactured. In particular, the dummy wire may be disposed over a portion of the substrate 100 on which the sealing part 700 may be disposed.

The sealing part 700 may firmly couple the substrate 100 to the encapsulation substrate 500A.

Because the first display area DA1, the second display area DA2, the first non-display area NDA1, and the second non-display area NDA2 may be similar to those described above with reference to FIGS. 1 through 8, detailed descriptions thereof will be omitted here.

Figure 13:
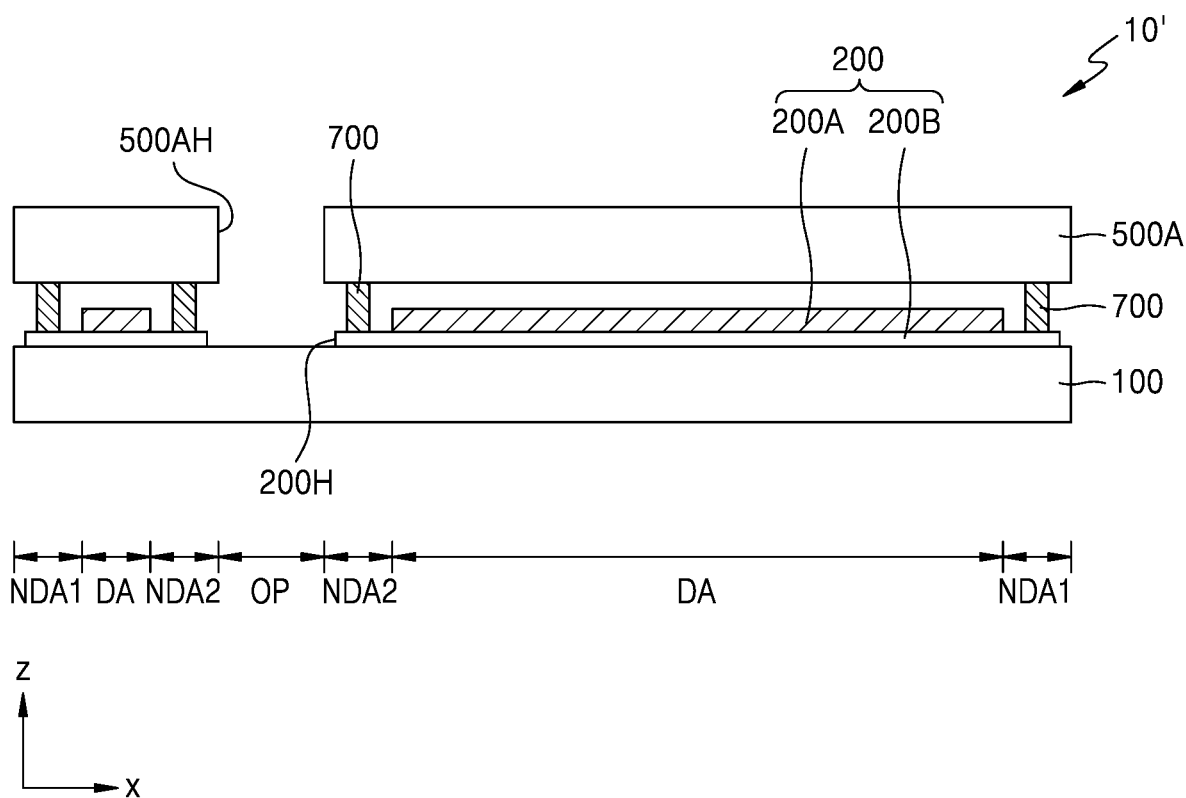
FIG. 13 is a schematic cross-sectional view of a display panel according to another embodiment.

FIG. 13 is a schematic cross-sectional view of a display panel 10' according to another embodiment.

Referring to FIG. 13, the display panel 10' may include the through hole 500AH formed only in the encapsulation substrate 500A. The display element layer 200A may not be disposed in the opening area OP. The pixel circuit layer 200B may not be formed in the opening area OP. The through hole 500AH of the encapsulation substrate 500A may be formed by a removing part including a drill or the like.

Because the first display area DA1, the second display area DA2, the first non-display area NDA1, and the second non-display area NDA2 may be similar to those described above with reference to FIGS. 1 through 8, detailed descriptions thereof will be omitted here.

FIG. 14 schematic is a cross-sectional view of a display panel 10' according to another embodiment.

Referring to FIG. 14, the display panel 10' may not include a separate through hole in the opening area OP. In the opening area OP, the pixel circuit layer 200B may be disposed, and the display element layer 200A may not exist. The pixel circuit layer 200B included in the display layer 200 or the insulating layers included in the pixel circuit layer 200B may be disposed in the opening area OP. According to another embodiment, no special layers may be disposed in the opening area OP, in addition to the substrate 100. The sealing part 700 may be disposed only in the first non-display area NDA1.

Because the first display area DA1, the second display area DA2, the first non-display area NDA1, and the second non-display area NDA2 may be similar to those described above with reference to FIGS. 1 through 8, detailed descriptions thereof will be omitted here.

Figure 15:
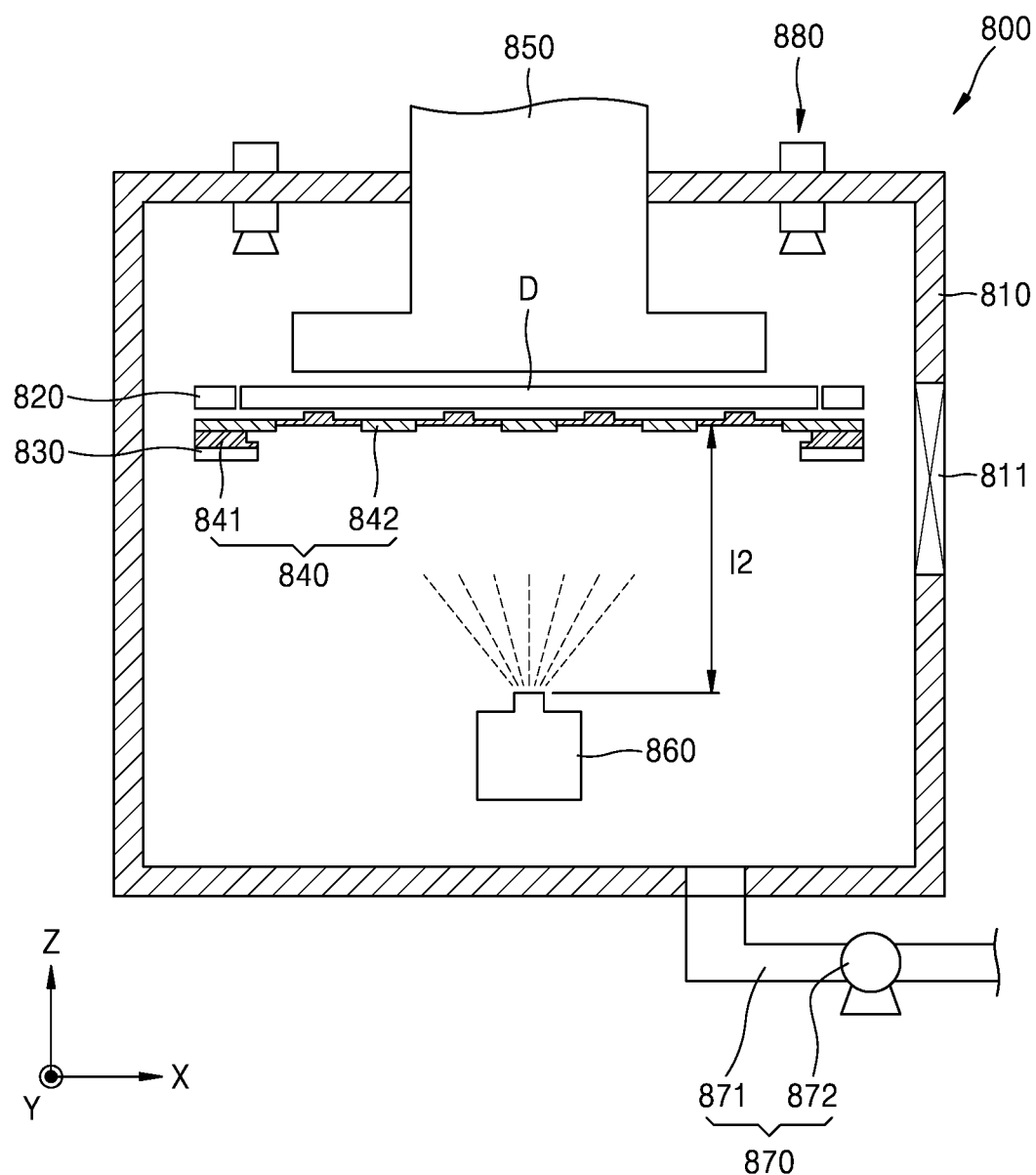
FIG. 15 is a schematic cross-sectional view of an apparatus for manufacturing a display apparatus, according to an embodiment.
Figure 16:
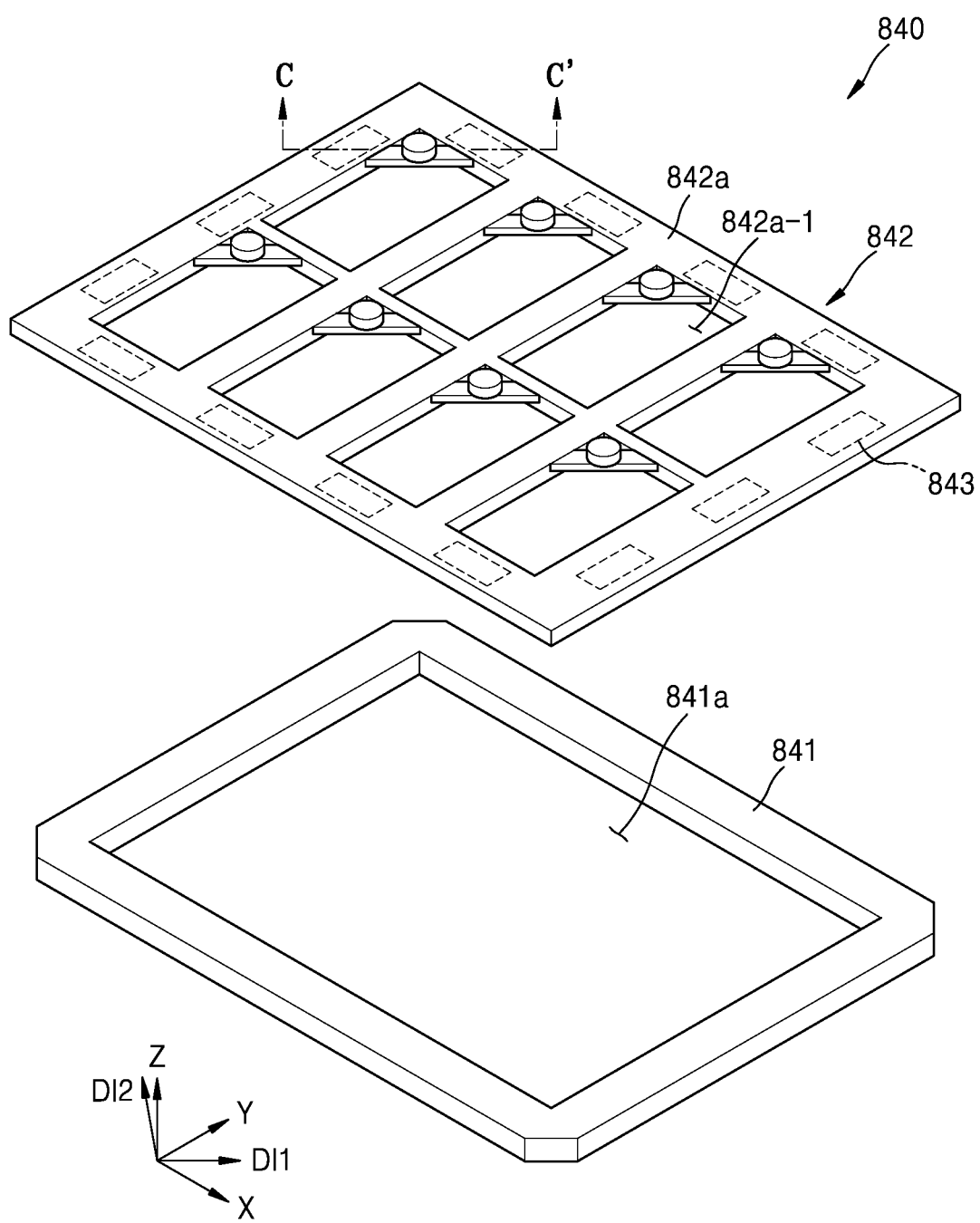
FIG. 16 is a schematic perspective view of a mask assembly illustrated in FIG. 15, according to an embodiment.
Figure 17:
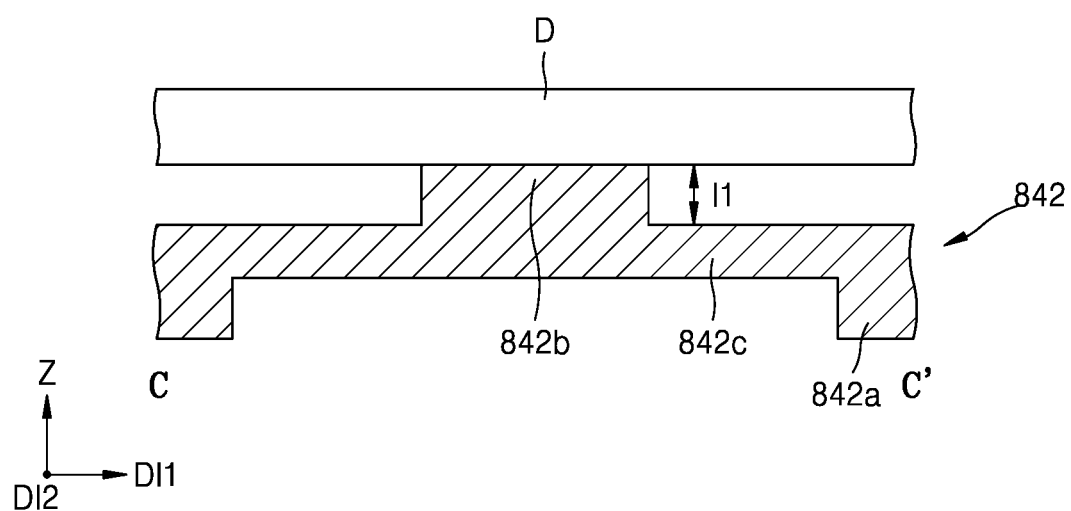
FIG. 17 is a schematic cross-sectional view of a mask sheet taken along line C-C' of FIG. 16, according to an embodiment.

FIG. 15 is a schematic cross-sectional view of an apparatus 800 for manufacturing a display apparatus, according to an embodiment. FIG. 16 is a schematic perspective view of a mask assembly 840 illustrated in FIG. 15. FIG. 17 is a schematic cross-sectional view of a mask sheet 842 taken along line C-C' of FIG. 16.

Referring to FIGS. 15 through 17, the apparatus 800 may include a chamber 810, a first support 820, a second support 830, the mask assembly 840, a source 860, a pressure adjuster 870, and a vision part 880.

The chamber 810 may have a space formed therein, and deposition may be performed in the space. An open portion may be formed in the chamber 810, and a gate valve 811 may be disposed in the open portion to close or open the open portion.

The first support 820 may be disposed in the chamber 810 and may support a display substrate D. As shown in FIGS. 7, 8, and 12 described above, the display substrate D may include the substrate 100, the buffer layer 101, the first gate insulating layer 103, the second gate insulating layer 105, the interlayer insulating layer 107, the planarization layer 109, the pixel defining layer 112, the pixel electrode 310, the first thin-film transistor T1, the second thin-film transistor T2, and the storage capacitor Cst.

The first support 820 may have various shapes. For example, the first support 820 may be fixed inside of the chamber 810, and the display substrate D may be seated on the first support 820. According to another embodiment, the first support 820 may have a shuttle shape that may be linearly movable in the chamber 810. According to another embodiment, the first support 820 may have a clamp shape that may be disposed in the chamber 810 and may hold the display substrate D. According to another embodiment, the first support 820 may be disposed in the chamber 810, and may include an electrostatic chuck or adhesive chuck that may support the display substrate D. The first support 820 is not limited thereto, and the first support 820 may include any of devices and structures that may support the display substrate D. However, for convenience of description, a case where the first support 820 may be fixed to the inside of the chamber 810 and the display substrate D may be seated on the first support 820 will now be described.

The mask assembly 840 may be disposed on the second support 830 and may be supported by the second support 830. The second support 830 may adjust a location of the mask assembly 840. For example, the second support 830 may raise and lower or rotate the mask assembly 840 by a distance, and also may linearly move the mask assembly 40 in a direction.

The mask assembly 840 may selectively transmit a deposition material. The mask assembly 840 may include one or more openings 842*a*-1. For example, according to an embodiment, the mask assembly 840 may include an opening 842*a*-1 that may transmit the deposition material. A deposition material that may have passed through the opening 842*a*-1 may be deposited on an area of the display substrate D and thus may form a display area. According to another embodiment, the mask assembly 840 may include openings 842*a*-1 that may transmit the deposition material. The display substrate D may be divided into areas, and a deposition material that may have passed through each of the openings 842*a*-1 may be deposited on each of the areas of the display substrate D and thus may form a display area in each of the areas. In particular, the areas of the display substrate D may be separated from each other after the deposition material may be deposited, and thus a single display apparatus may be manufactured. For convenience of description, a case where the mask assembly 840 may include openings 842*a*-1 will now be described.

According to an embodiment, the mask assembly 840 may include a mask sheet 842. According to another embodiment, the mask assembly 840 may include a mask frame 841 and the mask sheet 842. For convenience of description, a case where the mask assembly 840 includes the mask frame 841 and the mask sheet 842 will now be described.

The mask frame 841 may include an opening 841*a* at its center. The mask frame 841 may have a shape, such as a window frame.

The mask sheet 842 may be disposed on the mask frame 841. One mask sheet 842 or multiple mask sheets 842 may be included. In case that multiple mask sheets 842 are included, the multiple mask sheets 842 may each be formed to have a plate shape and may be disposed on the mask frame 841 to be adjacent to each other. For example, the mask sheets 842 may be disposed apart from each other in a lengthwise direction of the mask frame 841 (for example, the X-axis direction of FIG. 10) or in a width direction of the mask frame 841 (for example, the Y-axis direction of FIG. 10). However, for convenience of description, a case where one mask sheet 842 may be formed will now be described.

The mask sheet 842 may include a body portion 842*a*, a shielding portion 842*b*, and a rib 842*c*.

The body portion 824*a* may include openings 842*a*-1 disposed to correspond to the areas of the display substrate D, respectively. Each of the openings 842*a*-1 may have a shape that corresponds to a display area of each area of the display substrate D. The deposition material that may have passed through each opening 842*a*-1 may be deposited on each area of the display substrate D and thus may form the display area. After display areas are formed on the areas of the display substrate D, respectively, the areas of the display substrate D may be separated from each other, and thus a single display panel may be manufactured. According to another embodiment, the body portion 842*a* may include a single opening 842*a*-1 and thus may guide a deposition material to a single display area of the display substrate D. In this way, a single display panel may be manufactured. For convenience of description, a case where the body portion 842*a* includes openings 842*a*-1 will now be described.

The shielding portion 842*b* may be extended to the rib 842*c* such as to protrude toward the display substrate D. One side of the shielding portion 842*b* (or an end of the shielding portion 842*b*) may be disposed farther from the source 860 than one side of the rib 842*c*. The shielding portion 842*b* may have a planar shape that may correspond to the shape of an opening area as described above. For example, in case that the opening area to be formed may be circular, the shielding portion 842*b* may be formed to have a circular planar shape. According to another embodiment, in case that the opening area to be formed may be polygonal, the shielding portion 842*b* may be formed to have a polygonal planar shape. The shielding portion 842*b* is not limited thereto, and may be formed to correspond to the shape of the opening area according to the shape of the opening area.

One side of the shielding portion 842*b* facing the display substrate D may be disposed closer to the display substrate D than one side of the body portion 842*a* facing the display substrate D. The shielding portion 842*b* may completely adhere to the display substrate D.

The rib 842*c* may extend diagonally with respect to a lengthwise direction of the mask sheet 842 (for example, an X-axis direction of FIG. 2 or a Y-axis direction of FIG. 2). The rib 842*c* may be disposed in each opening 842*a*-1. In other words, the rib 842*c* may extend across the opening 842*a*-1.

A first distance I1 from one surface of the rib 842*c* opposite to the display substrate D to one surface of the shielding portion 842*b* opposite to the display substrate D may be equal to or greater than $2.7 \times 10^{-4}$ times a second distance I2 from one surface of the rib 842*c* opposite to the source part 860 to the source part 860. In case that the first distance I1 may be less than $2.7 \times 10^{-4}$ times the second distance I2, a deposition material may be deposited on a portion of the display substrate D disposed on a rear surface of the shielding portion 842*b*, and thus the first functional layer 321, the emission layer 322, the second functional layer 323, the opposite electrode 330, or the capping layer 400 may be formed, thereby reducing transmittance in the opening area.

The mask frame 841 and/or the mask sheet 842 may further include a magnetic body 843. In case that the mask frame 841 includes the magnetic body 843, the mask frame 841 itself may be formed of a magnetic body. As shown in FIG. 10, magnetic bodies 843 may be included and may be disposed on the mask frame 841 to be apart from each other. In case that the mask sheet 842 includes the magnetic body 843, the mask frame 842 may be formed of a magnetic body. As shown in FIG. 10, magnetic bodies 843 may be included and may be disposed on the body portion 842*a* to be apart from each other. For convenience of description, a case where the mask sheet 842 includes magnetic bodies 843 will now be described.

The mask frame 841 and/or the mask sheet 842 may include carbon fiber. According to an embodiment, the mask sheet 842 may be formed of carbon fiber, and the mask frame 841 may be formed of a magnetic body or an Invar material. According to another embodiment, the mask frame 841 and the body portion 842*a* may be formed of a magnetic body or Invar material, and the rib 842*c* and the shielding portion 842b may be formed of carbon fiber. The rib 842c may be fixed to the body portion 842a by a bolt or screw or by a special adhesive material (for example, a torr seal such as a high vacuum leak sealant (VAC). According to another embodiment, the mask frame 841, the body portion 842a, and the rib 842c may be formed of a magnetic body or an Invar material, and only the shielding portion 842b may be formed of carbon fiber. According to another embodiment, both the mask frame 841 and the mask sheet 842 may be formed of carbon fiber. For convenience of description, a case where the mask sheet 842 may be integrated and may be formed of carbon fiber will now be described.

The apparatus 800 may further include a magnetic force generator 850 disposed in a chamber 810. The magnetic force generator 850 may or may not be included in the form of the mask assembly 840. However, for convenience of description, a case where the apparatus 800 for manufacturing a display apparatus includes the magnetic force generator 850 will now be described.

The magnetic force generator 850 may be disposed in the chamber 810 and thus may force the mask assembly 840 to be closer toward the display substrate D. The magnetic force generator 850 may include at least one of a magnet and an electromagnet that generate magnetic forces.

The source 860 may store the deposition material, and may sublime or vaporize the deposition material. The source 860 may include a heater to heat the deposition material. The source 860 may further include a crucible to store the deposition material. The source 860 may remain in a single location in the chamber 810 or may linearly move or reciprocate in one direction in the chamber 810. In case that the source 860 moves, the chamber 810 may include a source driving part (not shown) that may drive the source 860 to linearly move and reciprocate. The source driving part may include a linear motor. However, for convenience of description, a case where the source 860 may be fixed in the chamber 810 will now be described.

The vision part 880 may be disposed in the chamber 810 and may photograph at least one of the display substrate D and the mask assembly 840. The display substrate D and the mask assembly 840 may be disposed based on data obtained by photographing conducted by the vision part 880.

The pressure adjuster 870 may be connected to the chamber 810 and may adjust an internal pressure of the chamber 810. The pressure adjuster 870 may include a guide pipe 871 connected to the chamber 810, and a vacuum pump 872 provided on the guide pipe 871 to adjust the internal pressure of the chamber 810. According to an operation of the vacuum pump 872, gas may be discharged from the chamber 810, or special gas may be supplied into the chamber 810.

When the apparatus 800 manufactures a display apparatus, the display substrate D may be disposed in the chamber 810. The mask assembly 840 may be disposed in the chamber 810.

The display substrate D may be disposed on the first support 820, and the mask assembly 840 may be disposed on the second support 830.

When the display substrate D and the mask assembly 840 are disposed as described above, an alignment mark of the display substrate D and an alignment mark of the mask assembly 840 may be photographed by the vision part 880 and compared with each other, and accordingly the display substrate D and the mask assembly 840 may be aligned. The second support 830 may be able to minutely adjust the location of the mask assembly 840.

The magnetic force generator 850 may apply a magnetic force to the mask assembly 840. In case that the magnetic force generator 850 applies a magnetic force as described above, the mask assembly 840 may move toward the display substrate D.

The shielding portion 842b may completely adhere to the display substrate D and thus may contact one surface of the display substrate D or may come close to the display substrate D.

The source 860 may operate to supply the deposition material into the chamber 810. At this time, the deposition material may pass through the openings 842a-1 and may be deposited on the display substrate D. A deposition material that may have passed through the openings 842a-1 may be deposited on first and second display areas (not shown) of the display substrate D.

In the above case, a portion of the display substrate D may be exposed via the openings 842a-1, and another portion of the display substrate D may not be exposed due to a portion of the mask sheet 842 having no openings 842a-1 formed therein, the rib 842c, and the shielding portion 842b. Accordingly, the deposition material may be deposited on the exposed portion of the display substrate D.

While the deposition material may be deposited as described above, the deposition material may also be blocked (or selectively blocked) by the rib 842c. However, because the deposition material sprayed by the source 860 may be incident upon the display substrate D at various angles, a portion of the deposition material may be deposited on a portion of the display substrate D that may be opposite to the rib 842c. In other words, a portion of the deposition material sprayed by the source 860 that forms at least a certain angle with respect to the one surface of the display substrate D where the deposition material may be deposited may be slantly incident upon the one surface of the display substrate D and thus may reach a portion of the display substrate D disposed on the rear surface of the rib 842c. In particular, because a portion of the deposition material sprayed by the source 860 that has avoided the rib 842c may be deposited on the display substrate D, even in case that the rib 842c may be disposed, the deposition material may be deposited on a display area of the display substrate D disposed on the rear surface of the rib 842c. The rib 842c may be disposed somewhat apart from the display substrate D and thus may not disturb deposition of the deposition material on the portion of the display substrate D disposed on the rear surface of the rib 842c.

When the deposition material may be deposited as described above, because the shielding portion 842b may completely adhere to the display substrate D as described above, the deposition material may not be deposited on a portion of the display substrate D that may face the shielding portion 842b. Accordingly, the deposition material may be deposited on a remaining area of the display area of the display substrate D except for the shielding portion 842b. Because the deposition material may not be deposited on the portion of the display substrate D that faces the shielding portion 842b, a second non-display area and an opening area where the deposition material may not be deposited may be formed in the display substrate D.

While the above-described operation may be conducted, a vacuum pump 872 may operate to discharge gas from the chamber 810.

In case that the above-described process may be completed, the mask assembly 840 may be led out to outside of the chamber 810. At this time, the vacuum pump 872 may operate to adjust the internal pressure of the chamber 810 to be the same as or similar to an atmospheric pressure.

Thereafter, the display substrate D may be discharged to outside of the chamber 810. After a new display substrate D may be inserted into the chamber 810, the above-described process may be repeated. In the display substrate D on which the deposition material may have been deposited as described above, a hole may be formed in the opening area via application of laser or mechanical abrasion, and thus some layers may be removed.

When the above-described process may be completed, a thin-film encapsulation layer may be formed on the display substrate D on which the deposition material has been deposited.

Thus, in the apparatus 800 for manufacturing a display apparatus and a method of manufacturing a display apparatus, a display apparatus having an opening area formed therein may be manufactured. Moreover, in the apparatus 800 for manufacturing a display apparatus and the method of manufacturing a display apparatus, deposition of the deposition material in the opening area may be prevented by a simple structure, and thus generation of a foreign material during formation of the opening area may be minimized.

Figure 18:
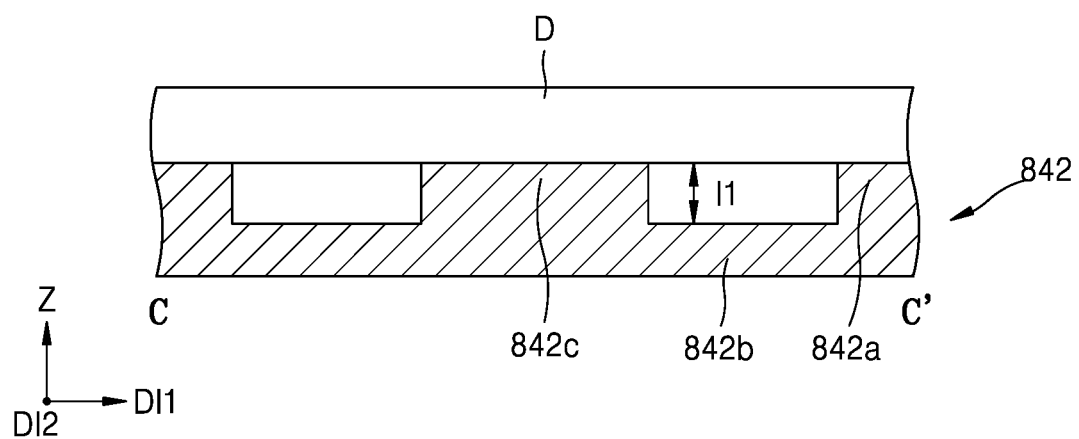
FIG. 18 is a schematic cross-sectional view of the mask sheet of FIG. 15, according to another embodiment.

FIG. 18 is a schematic cross-sectional view of another embodiment of the mask sheet 842 of FIG. 15.

Referring to FIG. 18, the mask assembly 840 may include a mask sheet 842. The mask sheet 842 may include a body portion 842a, a shielding portion 842b, and a rib 842c. The body portion 842a, the shielding portion 842b, and the rib 842c may be similar to those described above with reference to FIGS. 15 through 17, and thus detailed descriptions thereof will be omitted.

One side of the shielding portion 842b facing the display substrate D and one side of the body portion 842a facing the display substrate D may be spaced apart from the display substrate D by the substantially same distance. The mask sheet 842 may completely adhere to the display substrate D, and thus, even in case that an external force may be applied to the mask sheet 842, deformation of the mask sheet 842 may be minimized. In particular, a force that may be applied from the mask sheet 842 to the display substrate D may prevent deformation of the mask sheet 842. Moreover, because the mask sheet 842 may completely adhere to the display substrate D, the mask sheet 842 may be prevented from being deformed due to distortion or the like of the mask sheet 842 that may be caused by a deposition material of a high temperature.

Figure 19:
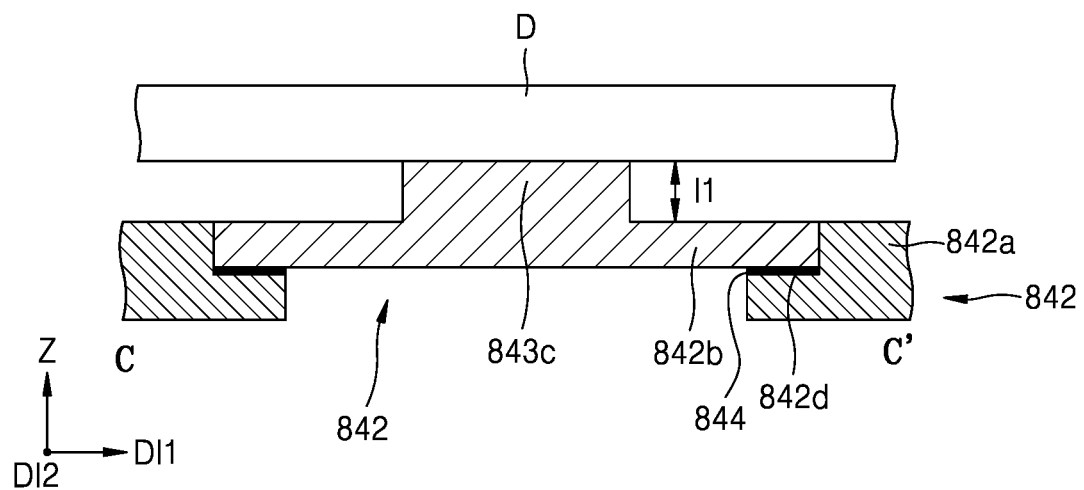
FIG. 19 is a schematic cross-sectional view of the mask sheet of FIG. 15, according to another embodiment.

FIG. 19 is a schematic cross-sectional view of another embodiment of the mask sheet 842 of FIG. 15.

Referring to FIG. 19, the mask assembly 840 may include a mask sheet 842. The mask sheet 842 may include a body portion 842a, a shielding portion 842b, and a rib 842c. The body portion 842a, the shielding portion 842b, and the rib 842c may be similar to those described above with reference to FIGS. 15 through 17, and thus detailed descriptions thereof will be omitted.

The body portion 842a and the rib 842c may be formed to be separated from each other. The body portion 842a and the rib 842c may be formed of different materials. For example, the body portion 842a may include a magnetic body or Invar, and the rib 842c may be formed of carbon fiber. The shielding portion 842b may also be formed of carbon fiber.

A seating groove 842d on which ends of the rib 842c may be seated may be formed in the body portion 842a. An adhesive 844 may be disposed between the rib 842c and the body portion 842a. The adhesive 844 may include a torr seal as described above.

One side of the shielding portion 842b facing the display substrate D and one side of the body portion 842a facing the display substrate D may be spaced apart from the display substrate D by the substantially same distance or by different distances. A distance from the display substrate D to the one side of the shielding portion 842b facing the display substrate D may be less than or equal to a distance from the display substrate D to the one side of the body portion 842a.

Accordingly, the shielding portion 842b may prevent the deposition material from being deposited in a partial area of the display substrate D.

Figure 20:
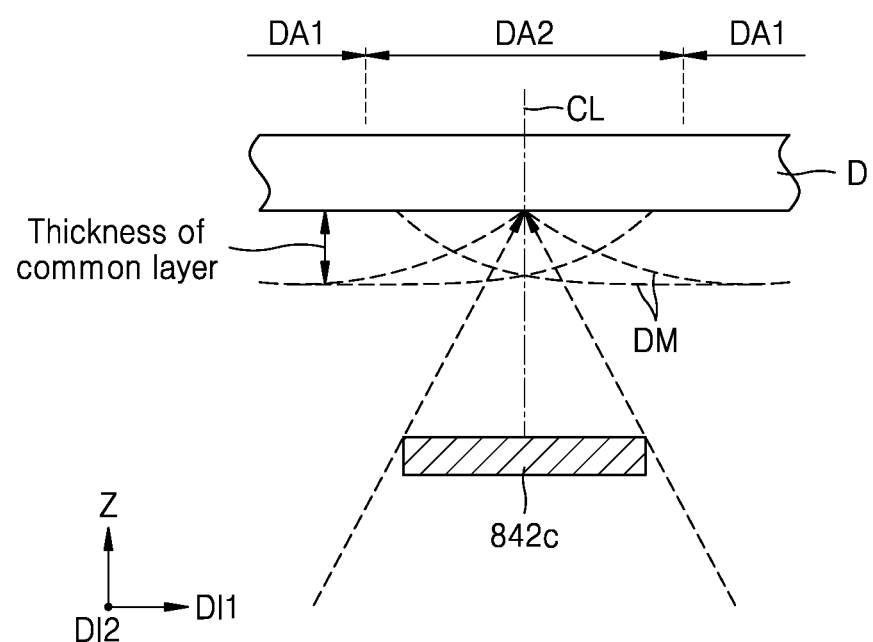
FIG. 20 is a schematic cross-sectional view illustrating deposition of a deposition material that passed through a rib illustrated in FIGS. 17 through 19 on a display substrate, according to an embodiment.

FIG. 20 is a schematic cross-sectional view illustrating deposition of a deposition material having passed through the rib 842c of FIGS. 17 through 19 on a display substrate D.

Referring to FIG. 20, in case that a deposition material DM may be deposited on the display substrate D via the mask assembly 840, a portion of the deposition material DM may be blocked (or selectively blocked) by the rib 842c in a portion of the display substrate D that faces the rib 842c.

Because the deposition material DM supplied by a source (not shown) may be incident upon one surface of the display substrate D at various angles or in various directions, another portion of the deposition material DM may not be blocked by the rib 842c and may reach the portion of the display substrate D that faces the rib 842c.

A deposition material DM having passed through an edge portion of the rib 842c may reach a portion of the display substrate D at a center line CL traversing the center of the rib 842c, and the deposition material DM traveling from an edge of the rib 842c toward the center of the rib 842c may be blocked (or selectively blocked) by the rib 842c.

A thickness of the deposition material DM deposited on the display substrate D may linearly increase in a direction away from the center line CL traversing the center of the rib 842c. In other words, a thickness of a deposition material in the second display area DA2 formed by depositing the deposition material DM on the display substrate D may linearly increase in a direction from an arbitrary point of the second display area DA2 (for example, a center point) to an edge of the second display area DA2 (for example, a boundary between the first display area DA1 and the second display area DA2). A thickness of the deposition material in the edge of the second display area DA2 may be same or substantially same as a thickness of a deposition material in the first display area DA1.

Display apparatuses according to embodiments may have a uniform surface, and may prevent infiltration of oxygen and moisture to thereby provide an increased lifespan.

In methods of manufacturing a display apparatus, according to embodiments, occurrence of defects in the display apparatus may be minimized. In the methods of manufacturing a display apparatus, according to embodiments, a display apparatus having an increased lifespan may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display apparatus comprising:
a substrate comprising:
a first display area;
an opening area in the first display area;
a peripheral area surrounding at least a portion of the opening area; and
a second display area extended from the peripheral area to an edge of the first display area;
a pixel defining layer disposed on the substrate and including:
a first opening in the first display area; and
a second opening in the second display area;
a first common layer disposed in the first opening; and
a second common layer disposed in the second opening.

2. The display apparatus of claim 1, wherein the first common layer and the second common layer comprise at least one of:
an opposite electrode disposed over the first display area and the second display area; and
at least one of intermediate layers of the substrate.

3. The display apparatus of claim 1, wherein
the edge of the first display area is rectangular, and
the second display area is disposed diagonally to face a vertex of the first display area.

4. The display apparatus of claim 1, wherein a thickness of the first common layer is greater than a thickness of the second common layer.

5. The display apparatus of claim 1, wherein a thickness of the first common layer is same as a thickness of the second common layer.

6. The display apparatus of claim 1, wherein a thickness of the second common layer decreases in a direction from an edge of the second common layer to a center of the second common layer.

7. The display apparatus of claim 1, wherein a through hole is formed in the opening area.

* * * * *